US005402334A

United States Patent [19]

Pecora et al.

[11] Patent Number: 5,402,334
[45] Date of Patent: Mar. 28, 1995

[54] METHOD AND APPARATUS FOR PSEUDOPERIODIC DRIVE

[75] Inventors: Louis L. Pecora; Thomas L. Carroll, both of Alexandria, Va.

[73] Assignee: The United States of America as represented by the Secretary of the Navy, Washington, D.C.

[21] Appl. No.: 880,789

[22] Filed: May 11, 1992

[51] Int. Cl.⁶ ............................................. H03B 29/00
[52] U.S. Cl. .................................... 364/158; 364/148; 380/46
[58] Field of Search ............... 364/158, 159, 148, 152; 380/46; 318/705

[56] References Cited

PUBLICATIONS

Chua, Leon O. et al; "Sights and Sounds of Chaos"; IEEE Circuits and Devices Magazine; Jan. 1989; pp. 3-13.
Endo, Tetsuro et al; "Synchronization of Chaos in Phase-Locked Loops" IEEE Transactions on Circuits and Systems: vol. 38 No. 12 Dec. 1991; pp. 1580-1588.

Primary Examiner—Roy N. Envall, Jr.
Assistant Examiner—Brian C. Oakes
Attorney, Agent, or Firm—Thomas E. McDonnell; Daniel Kalish

[57] ABSTRACT

A controller is provided for driving at least two systems in synchronization with one another. The controller provides a pseudoperiodic drive to drive the two systems at a desired frequency and to ensure that the two systems are synchronized. The pseudoperiodic drive can be produced by combining a periodic drive with a chaotic drive, noise drive or an incommensurate frequency drive. Any of these types of drives can be combined with the periodic drive by adding to or modulating the periodic drive. Thus, the controller can drive the two systems in phase with one another by using the same pseudoperiodic drive.

28 Claims, 21 Drawing Sheets

TYPES OF ATTRACTORS IN PHASE SPACE

METHOD AND APPARATUS FOR PSEUDOPERIODIC DRIVE

BACKGROUND OF THE INVENTION

1. Field of the Invention

The present invention relates to an application of chaos theory to controlling in synchronization at least two systems and, more particularly, relates to a pseudoperiodic drive for controlling in synchronization at least two systems.

2. Description of the Related Art

FIG. 1 illustrates a conventional control system for controlling two response systems, a first system 110 and second system 120, by a conventional controller 130. The conventional controller 130 determines the location of the state variables of the first and second systems 110 and 120 from feedback therefrom. With knowledge of the location of the state variables of each response system, the conventional controller 130 controls the response systems to place the systems in synchronization with one another. By synchronization, it is meant that both systems are doing the same thing at the same time.

However, conventional controllers have drawbacks. First, for example, the conventional controller 130 is often limited to controlling only linear response systems 110 and 120. Second, in order to synchronize two systems, the conventional controller 130 requires the complexity of separate outputs to each system and a feedback input from each system. Third, an understanding of the response characteristics of the response systems is often built into the mechanism of the conventional system controller 130. Thus, the conventional controller 130 is often unable to effectively control the systems when a precise understanding of the systems is unobtainable. Furthermore, if one of the feedback or control paths between the controller and the response systems is disrupted due to an intermittent failure, the response system could rapidly diverge from its desired path. This is because the controller depends heavily on the understanding of the response systems. Furthermore, in a worst case scenario, the control systems could become irreversibly unstable.

Most man-made mechanical and electronic systems rely for their operation on linear behavior or simple nonlinear behavior, such as fixed points (stationary states) or periodic (cyclic) variations. Primarily this comes from an ignorance of more complex behavior and, subsequently, a lack of control over such behavior. Recently, in many areas of science, mathematics and engineering a new kind of behavior has become recognized as being generic in most nonlinear systems. This is called chaos. Being generic means that given any nonlinear dynamical system, it is very likely that in some regime of its parameter settings it has motion of this sort.

Systems evolving chaotically display a sensitivity to initial conditions. That is, two nearly identical systems started at slightly different values of their state variables will soon evolve to values which are vastly different and the systems will become completely uncorrelated, even though the overall patterns of behavior will remain the same. This makes the systems nonperiodic (no cycles whatsoever), a quality which can be exploited.

There are also other types of behavior in nonlinear systems which can lead to systems being out of phase or out of synchronization with each other. This behavior is multiple-period behavior and can occur in systems that are driven with a periodic signal or force. The out-of-phase problem has not been resolved with existing techniques. Several terms and concepts will now be defined which are necessary in understanding the control of nonlinear systems.

FIGS. 2(a) and 2(b) illustrate a moving pendulum and a phase plot of the motion of the moving pendulum to explain the principles of phase plots. FIG. 2(b) illustrates a phase plot of the motion of the pendulum illustrated in FIG. 2(a). The phase plot illustrated in FIG. 2(b) is a two-dimensional (x-y) plot, where the x-axis corresponds to one variable of interest (position of the pendulum) and the y-axis corresponds to another variable of interest (velocity of the pendulum) among a plurality of variables which describe the motion of the pendulum. Multi-dimensional phase space plots of a response system are possible if more than two dynamical variables are necessary to describe the system. Phase space is often referred to as state space.

A point in state or phase space describes, at once, the values of the dynamical variables of the system. Correspondingly, the path the point takes in phase space as the system evolves in time traces the behavior of the system. This path is often referred to as a trajectory. The trajectory describes the history of the system.

Phase space plots can be generated on the screen of a computer using equations to describe the motion of a system. It is also possible that an oscilloscope can be used to display a phase plot for two measured electrical quantities from a circuit (which is also a dynamical system) along x and y axes of the oscilloscope screen. On the screen, the changes of the x and y variables will create a pattern which will be a projection of the phase space trajectory onto two dimensions. This plot will be in real time because the oscilloscope time sweep is not used in an x/y plot of the voltage. It should be noted that a real time plot can be obtained by plotting a voltage ($x(t)$) vs. its delayed value ($x(t+\delta t)$), its derivative $\dot{x}(t)$, or its integral $<x(t)dt$.

Many physical systems often have dissipation, energy losses, or friction occurring naturally during their evolution. This manifests itself by having the phase space trajectory settle into motion on a particular path in the state space. In the damped linear pendulum, which is driven by a periodic force (e.g. someone being pushed gently on a swing), this results in the motion settling into a simple closed loop as shown in FIG. 2. For the linear pendulum, starting the system at any point in phase space will still result in its ending up on the same trajectory. In fact, any two pendula started at different initial points (called initial conditions) will end up having their phase space points not only on the same trajectory but, eventually, at the same moving point on the trajectory. In other words, they will have identical motion, and the same moving phase space point will describe both pendula. The final trajectory is called an attractor.

The above scenario is specific in some ways to linear systems, but nonlinear systems have analogous phase space properties. Nonlinear dynamical systems with dissipation will also have their final motion lie on some path (trajectory) confined to a much smaller region of phase space than is accessible to the system as a whole. However, in this case not all the initial conditions will lead to the same attractor. Nonlinear systems can have several different attractors present at the same time.

Which one the system will converge to will depend on where it started.

For example, in the case where a system consists of a ball under the influence of gravity and rolling friction riding on a surface that has multiple valleys, which valley the ball ends up in will depend on where it started and with what velocity it started (i.e., its phase space initial condition). In this example the final attractor is simply a fixed point (the ball comes to rest). The set of all phase initial points that go to a particular fixed point attractor is called the basin of attraction for that attractor.

These concepts generalize from this example to attractors that are not fixed points, e.g., loops, chaotic attractors, etc. Several can be present at the same time and each will have a basin of attraction. FIG. 3 shows schematically a phase space with two attractors. FIG. 4(a) through 4(d) respectively show representations of various attractors that can be present: fixed point, periodic (trajectories that close on themselves), quasiperiodic (trajectories with two or more incommensurate periodic frequencies), and chaotic (trajectories with no periodicities and often fractal structure). However simple or complex an attractor, once the system's motion converges to it, the motion remains on it, unless perturbed by an outside force (that is one not associated with the dynamics of the system and its attractors and not in force during the system's convergence to an attractor). If the outside force is small and the system remains in the same basin, then when the outside force is turned off the motion will again settle down to the same attractor. If the system's phase space point is moved to another basin it will settle onto another attractor.

An important fact to note is that the boundaries delimiting adjacent basins of attraction must in some way be associated with an unstable motion. This is because two points, however close but on opposite sides of the boundary must eventually go to different attractors far away from each other.

The entire phase space is divided into basins of attraction, one for each attractor. However, unlike the linear pendulum, there are attractors on which two phase space points (representing two identical systems started at different initial conditions) may never move about the attractor and merge to one moving point. A chaotic attractor is of this nature. In fact, at any time there is a separate point moving on the attractor corresponding to each initial condition in the basin of attraction. There are also periodic attractors which have two or more phase space points moving on them corresponding to different entire sets of initial conditions in the basin. These latter systems will now be discussed.

Many nonlinear systems when driven with periodic signals or forces have regimes of their parameters where they behave periodically, but with a period that is some multiple of the period of the driving signal. This has been known for decades and is behavior that is generic to nonlinear systems. What this means is that the systems take n driving periods (where n is some integer) to return to their starting points. For example, when n=2 the systems will have a period of repetition that is twice that of the driving signal. This latter case is often referred to as a period-doubled system. Many other period multiplicities are possible. The driven system can be at any of several different points moving on the attractor during each cycle of the drive. There are n such points for a period-n behavior. Which one the system is at will depend on where it started when the drive signal was turned on. All the points in the same basin of attraction end up on the same attractor, but the basin itself can be subdivided into domains. Points started in the same domain will end up converging to the same point moving around the attractor. Points started in different domains will end up on different points moving around the same attractor. Like adjacent basins, adjacent domains have a common boundary which is associated with an unstable motion.

The salient point is that if several nonlinear systems are being driven by a periodic signal, they can behave in a multiple-period fashion and be permanently out of phase with each other even though they are on the same attractor and undergoing the same type of motion. This is shown in FIG. 5 for a period-doubled motion. This out-of-phase situation is stable. Small perturbations (outside forces, as above) will not change it.

There are instances when out-of-phase behavior is undesirable. However, there may be simultaneous instances when multiple-period behavior is required (perhaps because of the shape of the waveform needed) or unavoidable. For example, this may occur in robotics, laser arrays, or physiology. In robotics, if nonlinear materials or actuators are being used, and these need to be driven by a timing signal, then any multiple-period behaving parts could get out of phase. In relation to lasers, if a set of lasers is being operated in a period-doubled regime to get a half-frequency component, then these should be in phase to maximize output intensity. In physiology, many tissues and organs are nonlinear. In order to keep such systems in synchronization with each other in many driven circumstances, the above in-phase requirements may be necessary.

Furthermore, it is well known that systems with several final forms of behavior (attractors) can have fractal basin boundaries. That is, the boundaries are complexly intertwined, in a fractal fashion. In this case, prediction of the final system state can be very difficult, since the fractal structure gives an uncertainty to determining the domain of the initial conditions. This uncertainty is difficult to eliminate. Decreasing the number of final attractors, especially those differing by phase shifts in the system's motion, will diminish or completely eliminate this problem.

SUMMARY OF THE INVENTION

It is therefore an object of the invention to provide a simple controller for driving at least two systems in synchronization with one another.

Another object of the invention is to provide a controller for driving at least two systems without feedback.

Another object of the invention is to provide a controller for driving two systems in synchronization with one another by using the same drive for each system.

Another object of the invention is to provide a controller for driving at least two systems with a pseudoperiodic drive.

Another object of the invention is to provide a controller for combining a periodic signal with a chaotic signal to drive at least two systems in synchronization.

Another object of the invention is to provide a drive signal by combining a periodic signal with a noise signal.

Another additional object of the invention is to drive at least two systems in synchronization by combining a periodic signal with an incommensurate frequency.

Another object of the invention is to drive at least two systems at a frequency of interest and in synchronization with one another by using a drive that has a chaotic frequency spectrum with a dominant peak at the frequency of interest.

Another object of the invention is to provide a controller capable of synchronizing two non-linear systems using a pseudoperiodic drive.

A further object of the invention is to provide a control system for driving two non-linear systems which can have multiple period behavior or multiple basins of attraction by using a pseudoperiodic signal.

The present invention provides a controller to drive at least two response systems in synchronization or in phase with one another. Synchronization of the response systems for purposes of this application means getting the response systems to do the same thing at the same time; to synchronize the response systems means the same thing as to get the response systems in phase without a requirement that the response systems have the same starting points. To drive the two response systems at a desired frequency and to synchronize the two response systems, the controller provides a pseudoperiodic drive. The pseudoperiodic drive can be produced by combining a periodic drive with a perturbing drive such as a chaotic drive, a noise drive or an incommensurate frequency drive. Any of these types of perturbing drives can be combined with the periodic drive by adding to or modulating the periodic drive. Thus, the controller can drive the two systems in phase with one another by using the same pseudoperiodic drive.

The above-mentioned objects and summary of the invention, as well as other objects, features and advantages of the invention, will become more apparent from the following description when considered in conjunction with the accompanying drawings. However, the drawings and descriptions are merely illustrative in nature and not restrictive.

DETAILED DESCRIPTION OF THE PREFERRED EMBODIMENTS

Figure 1:
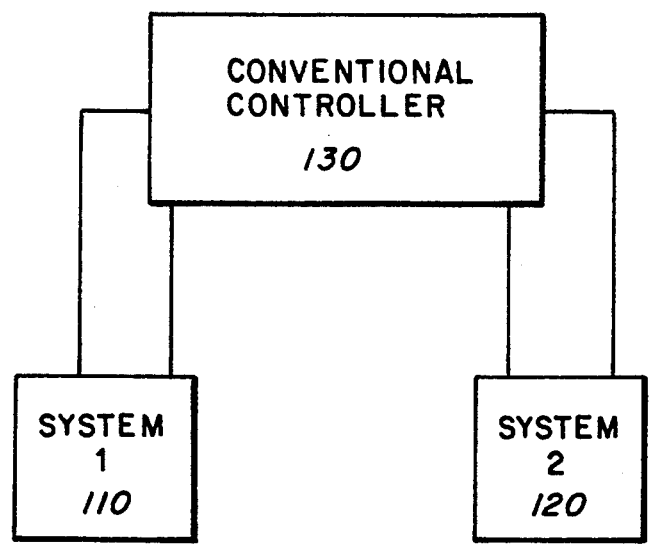
FIG. 1 is a schematic block diagram which illustrates a conventional controller of the prior art for driving two systems.
Figure 2A:
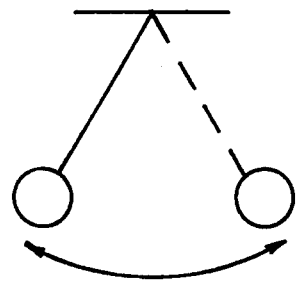
FIGS. 2(a) and 2(b) illustrate a moving pendulum and a phase plot of the motion of the moving pendulum to explain the principles of phase plots.
Figure 2B:
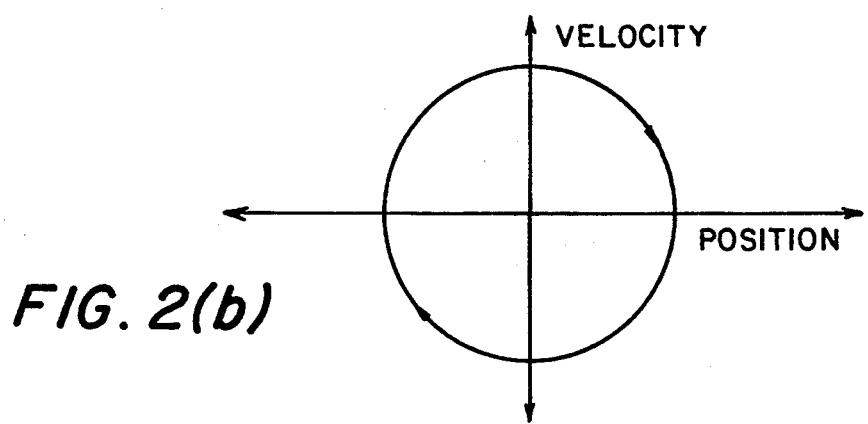
Figure 3:
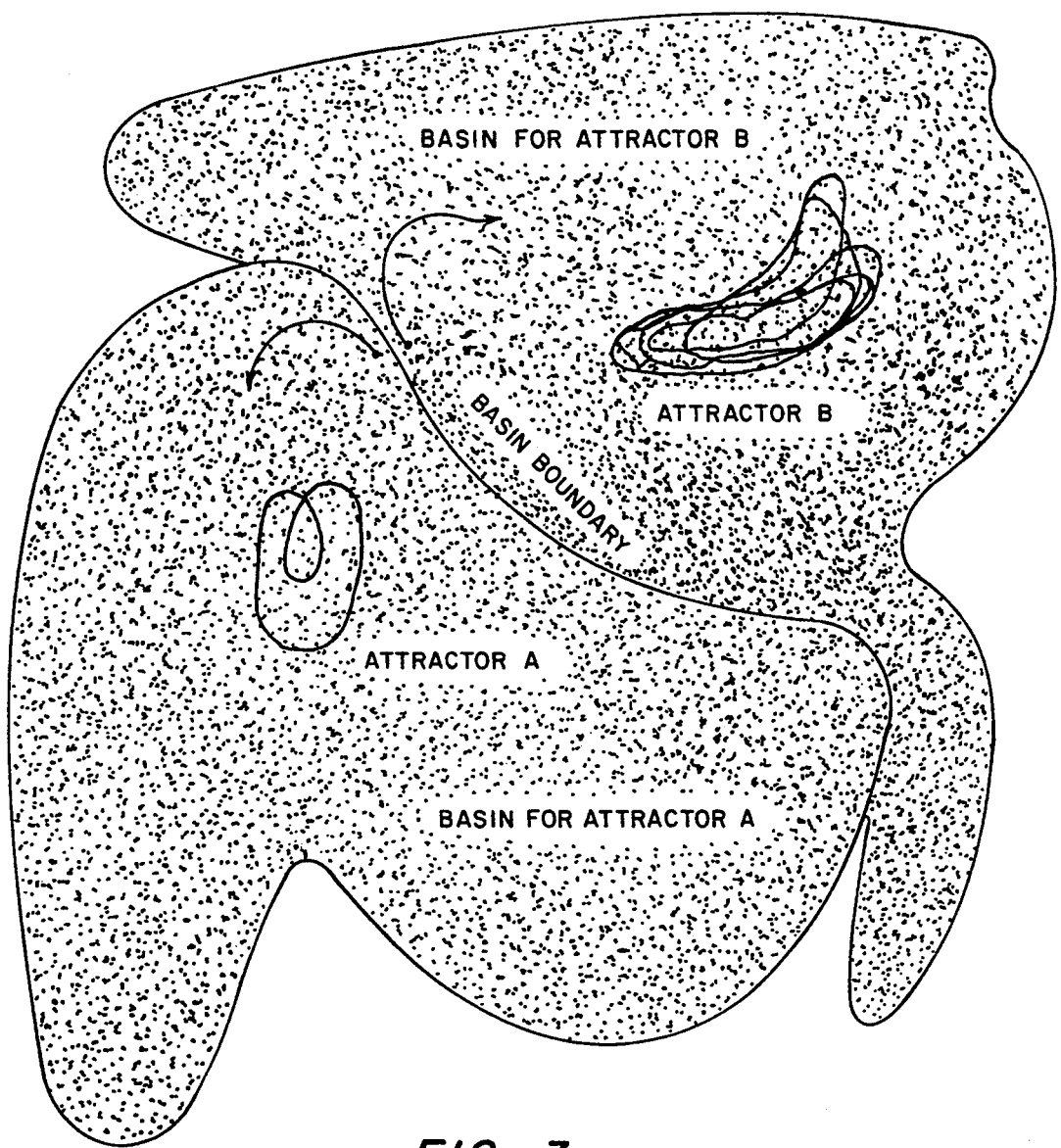
FIG. 3 illustrates two simultaneously present attractors, their basins of attraction, common basin boundary, and two points near the boundary which go different attractors.
Figure 4A:
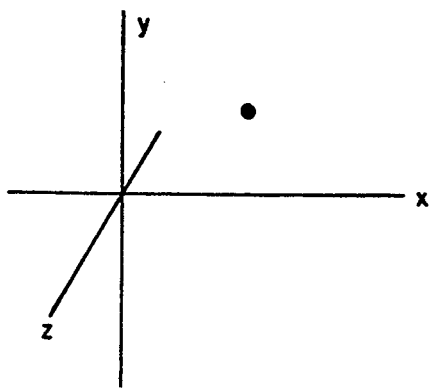
FIGS. 4(a), 4(b), 4(c) and 4(d) respectively illustrate schematic examples of a fixed point attractor, a periodic attractor, a quasiperiodic attractor and a chaotic attractor.
Figure 4B:
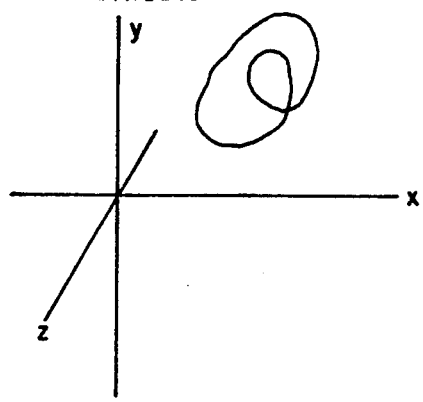
Figure 4C:
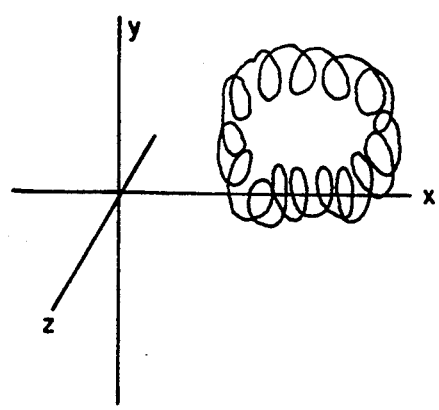
Figure 4D:
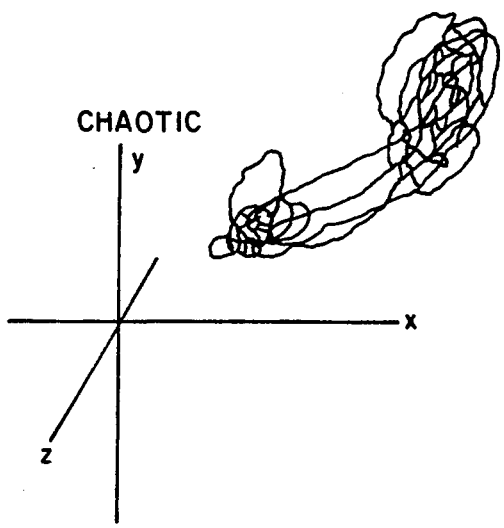
Figure 5:
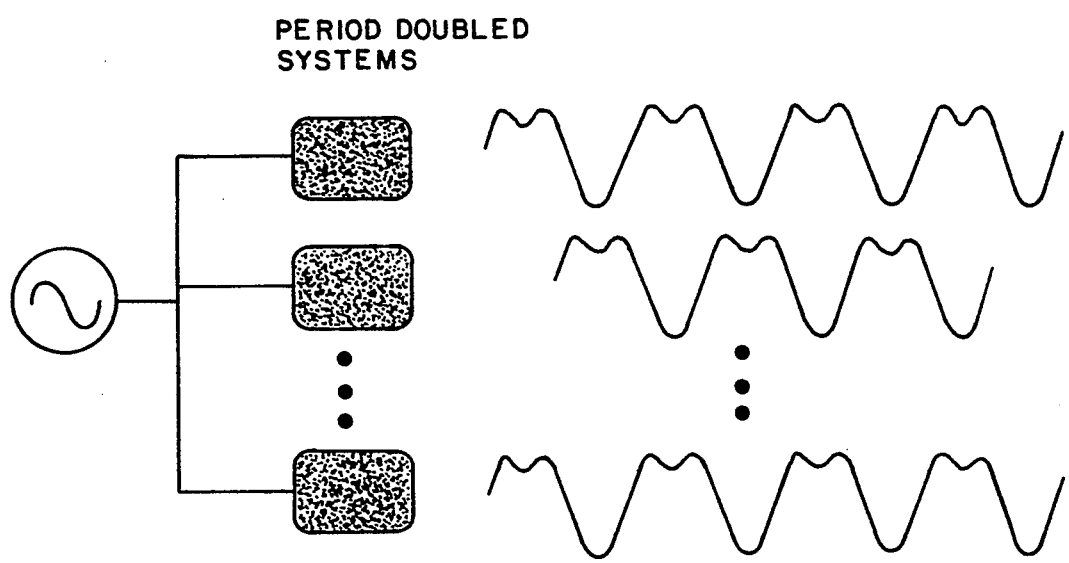
FIG. 5 illustrates several period-2 systems being driven by a sine-wave and some being one cycle out of phase with the others.

The present invention addresses the problem of maintaining a stable system motion close to the original multiple-period and/or multiple-attractor systems while keeping all such systems in phase (synchronized). The present invention does this by changing the periodic driving force of the system to one that is perturbed and not periodic. In many cases that will entail using chaos with the original periodic drive or replacing the periodic drive entirely by a chaotic one with a strong spectral component similar to the original periodic signal. Such pseudoperiodic drives have been discussed above. The idea is that what is causing the multiple-period behavior is the very periodicity of the drive. By eliminating it with chaos (no periodicity) the out-of-phase problem should be eliminated, and all points in the basin of attraction will converge to the same point moving on the attractor. The latter also requires that the motion remain stable, otherwise chaotic behavior would be created on the attractor and no synchronization would be possible. So the goal is to make the drive as nonperiodic as possible without destroying completely the attractor or destroying the stability. The stability can be measured by the Lyapunov exponents of the driven system. These Lyapunov exponents depend on the drive, and therefore are called "conditional Lyapunov exponents." As long as these are all negative the motion remains stable, even when driving with chaos.

The reason the pseudoperiodic driving may work can be seen by considering two nearly identical systems that are on the same multiple period attractor but are out of phase, i.e., they started in different domains of attraction. The perturbed driving signal may move one of the system's phase space points close to the domain boundary and eventually cause it to go over the boundary to the adjacent domain. Then it would fall onto the same attractor, but this time also converge to the same phase space point as the twin system, thus causing them to come into phase or synchronize. Once synchronized, further perturbations from the drive will act the same way on both systems (since they are now at the same phase space point and the same drive is applied to both). Therefore, they will not be knocked out of phase again. If in some sense the chaos was being added to the original periodic drive to make a pseudoperiodic one, it should be expected that adding a little amount of chaos will have no effect, but more than some amount (a threshold amount) would have to be added to get the pseudoperiodic drive to work. This is further discussed below.

This scenario is the same as saying that the pseudoperiodically driven attractor collided with the domain boundary. Since the boundary is unstable, it is destroyed by colliding with the attractor. This leaves only one domain where there were two. Now all points in the basin will converge to the same attractor and be in synchronization with each other. This collision is referred to as a crisis in the literature.

Note that similar destruction of basin boundaries can occur between any two attractors so that pseudoperiodic driving could be used when it is desired to eliminate the possibility of a system going to either of two or more separate attractors.

A more mathematical description of this phenomena will now be discussed. The mathematics is presented in the setting of ordinary differential equations, but it should be realized that any set of evolution equations will have parallel concepts and will be susceptible to elimination of multiple periodic motion and destruction of domain and basin boundaries, leading to synchronization. For example, iterative maps, in which time is considered discrete, not continuous, have been used heavily in nonlinear dynamics mathematics to understand various aspects of nonlinear behavior. These have associated with them similar concepts of attractor, basin, domain, conditional Lyapunov exponents, etc. and are therefore candidates for pseudoperiodic driving.

In the following discussion a heuristic argument is given for the simplification of period-n attractor basins. The origin of the drive signal is referred to as the "drive" system and the driven system is referred to as the "response" system.

A driven dynamical system $w=f(w,v)$ will be considered, where w and f are n-dimensional vectors and functions and v is a periodic driving signal having a periodically repeating waveform, such as an electrical cosine signal with stable rms voltage. Then v is changed slightly to a new driving signal v'. If w' ($t_0$) is an initial point in the v' driven system nearby w($t_0$) from the periodically driven system, their difference will evolve according to $$\frac{d(w'-w)}{dt} \equiv \Delta \dot{w} = f(w', v') - f(w, v) \quad (1)$$

which, by adding and subtracting $f(w,v')$, can be rewritten as $$\Delta \dot{w} = D_w f(w,v) \Delta w + B(t) \quad (2)$$

where $D_w f$ is the Jacobian of the vector field, $B(t)=f(w,v')-f(w,v)$, and the higher order terms have been dropped for now. Eq. (2) is a linear equation. Its solution can be given in terms of the transfer function $\Phi(t,t_0)$ for the homogeneous version of Eq. (2), viz., $$\Delta w(t) = \Phi(t, t_0) \Delta w(t_0) + \int_{t_0}^{t} \Phi(t, \tau) B(\tau) d\tau \quad (3)$$

If the original response system is stable, it will have negative conditional Lyapunov exponents. This means there exist two constants $c_1>0$ and $c_2>0$ such that $||\Phi|| \leq c_1 e^{-c_2 \cdot t}$. If B(t) is bounded by a constant $b_1>0$ (which it will be for many cases), $|\Delta w(t)| \leq c_1 b_1/c_2$ for large t.

For small deviations from the original periodic drive ($b_1$ small) the trajectory will always remain close to the original trajectory—multiple period attractors will remain nearly so. For larger deviations from the original drive the above analysis will not be valid for long times, since higher order terms cannot be dropped and $b_1$ may be large enough that $\Delta x$ can become on the order of the attractor size. So a threshold above which the behavior of the system will cease to be always close to that of the original response should be expected.

However, the new behavior above the threshold may still resemble the original response if the new response motion remains stable with respect to the new drive v' and the new drive is still not too different from the original. The simultaneous criteria of stability of the response to the new drive and similarity of the new drive to the original periodic one are important.

A chaotic drive can be used with spectral features similar to the original periodic drive. By tuning them so that their peaks match the frequencies of the original periodic drive, candidates are obtained for just the drives that are needed. Such a system is the Rössler system, $$\dot{x} = -(y+z)$$

$$\dot{y} = x + ay \quad (4)$$

$$\dot{z} = b + z(x-c)$$

In this system for certain parameter values (e.g. $a=b=0.2$, $4.35<c<7.0$) the behavior is generally chaotic, but the x and y components resemble sinusoidal signals.

There are several ways to construct the pseudoperiodic signal. Two ways will be presented here and other ways will be discussed in a later section on that topic.

One way is simply to replace the sinusoidal drive with the chaotic drive. Provided that the chaotic drive is close to the original sinusoidal drive, the response system should stay stable and, by the above analysis cease to be multiple period, but still have behavior close to the periodically driven system. This occurs in a computational experiment discussed below.

The addition of chaos can be accomplished in a more controlled fashion by adding the chaos to the periodic drive, viz., $$v'(t) = v(t) + \epsilon \cdot x(t) \quad (5)$$

with ε variable and x(t) a dynamical variable from the chaotic system. The variation of ε also serves to demonstrate a threshold phenomena mentioned above.

Figure 6A:
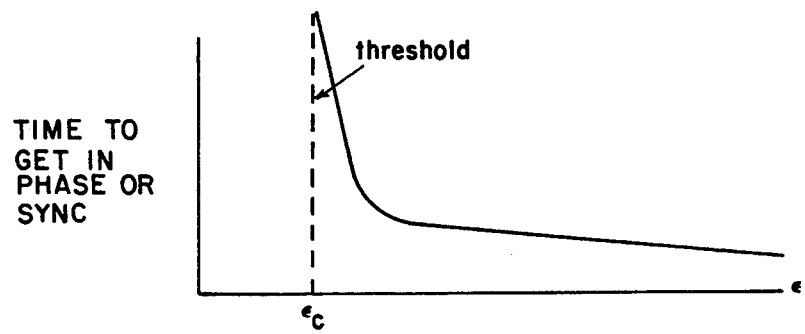
FIGS. 6(a), 6(b), 6(c) and 6(d) illustrate plots demonstrating how the characteristics of the control vary based on an amount of chaos added to the pseudoperiodic drive by the controller of the present invention.
Figure 6B:
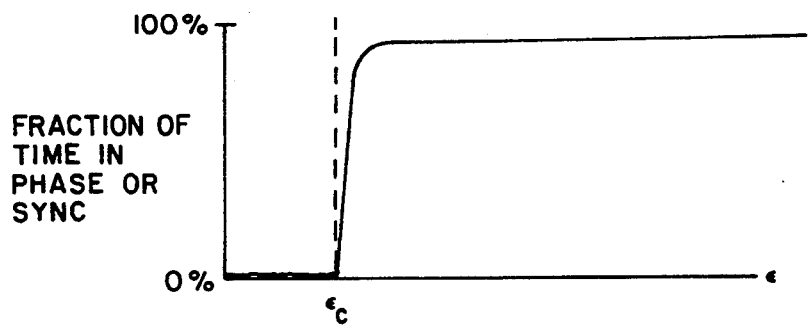
Figure 6C:
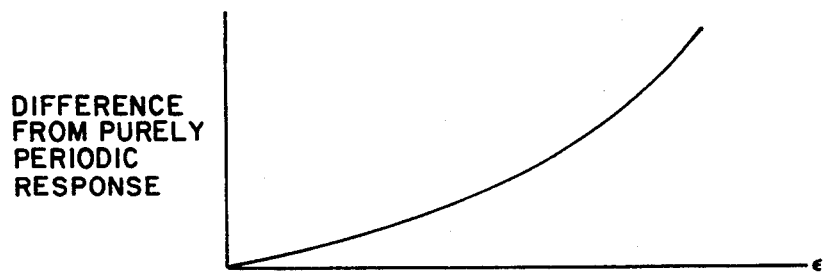
Figure 6D:
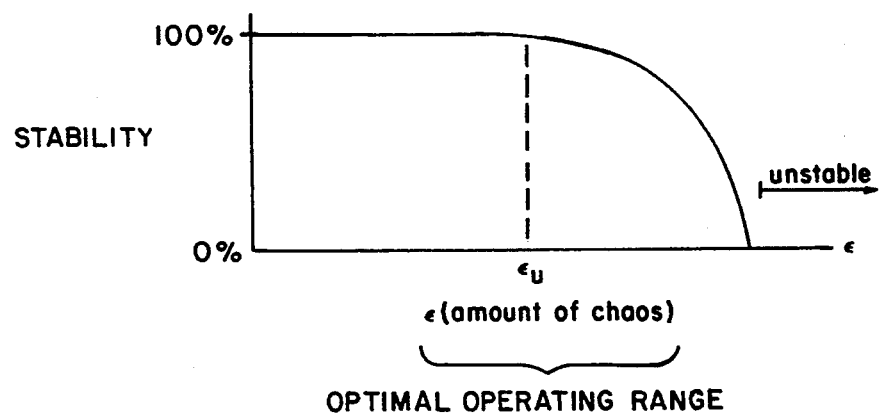

The existence of a threshold for the case of additive chaos implies an optimal operating range. This is shown in FIG. 6. There are several simultaneous criteria: be above threshold (as shown in FIG. 6(a)), be in synchronization a large fraction of the time (as shown in FIG. 6(b)), be close to the original attractor in shape (the drive should be close to a periodic drive, as shown in FIG. 6(c)), and be stable (as shown in FIG. 6(d)). Some of these (e.g. be above threshold and be stable) may be at cross-purposes in that one is more likely as chaos is added and the other becomes less likely. The optimum level of pseudoperiodic driving (or optimal operating range) is some mid-range level, as shown in FIG. 6(d).

Figure 7:
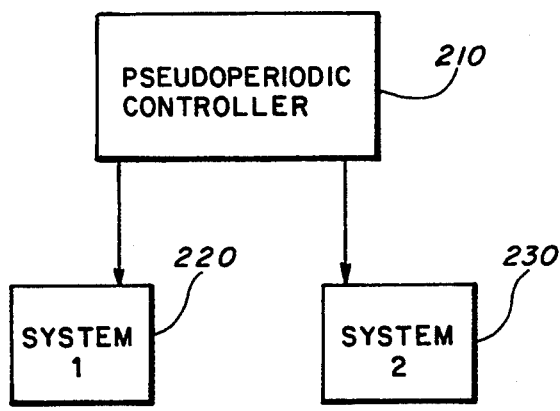
FIG. 7 is a schematic block diagram illustrating the pseudoperiodic controller of the present invention for driving at least two systems in synchronization.

FIG. 7 illustrates a schematic block diagram of the pseudoperiodic controller 210 of the present invention for driving a first system 220 and a second system 230 with a pseudoperiodic drive. Both the first system 220 and the second system 230 are driven by the same pseudoperiodic drive from the pseudoperiodic controller 210 as illustrated. No feedback or additional control paths are necessary and it is preferable that they not be included.

Figure 8:
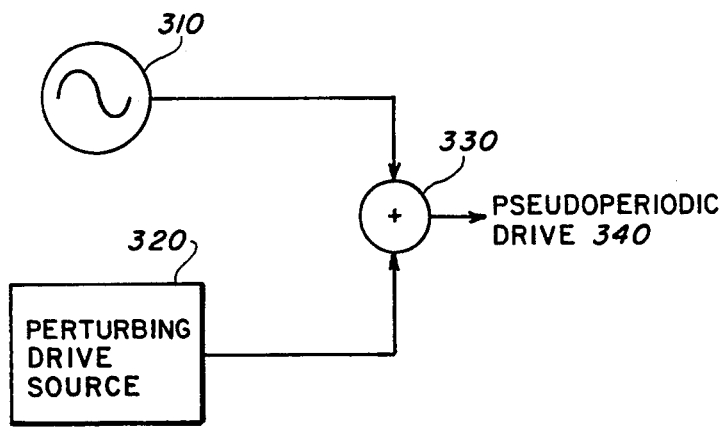
FIG. 8 is a schematic block diagram illustrating an example of the pseudoperiodic controller for producing the pseudoperiodic drive.

FIG. 8 illustrates a schematic block diagram of an example of the pseudoperiodic controller 210. A periodic source 310 provides a periodic drive at the frequency of interest for driving the system. The periodic drive can be, for example, an electrical cosine signal output from an oscillator circuit. A perturbing drive source 320 unresponsive to the periodic drive provides a perturbing drive. The perturbing drive can be, for example, a chaotic electrical signal output from a chaotic electrical circuit such as a Lorenz, Duffing or Rössler chaotic circuit. In the exemplary embodiment of FIG. 8, the periodic drive is combined with the perturbing drive, for example, by addition in an adder 330, to provide the pseudoperiodic drive 340.

Figure 9:
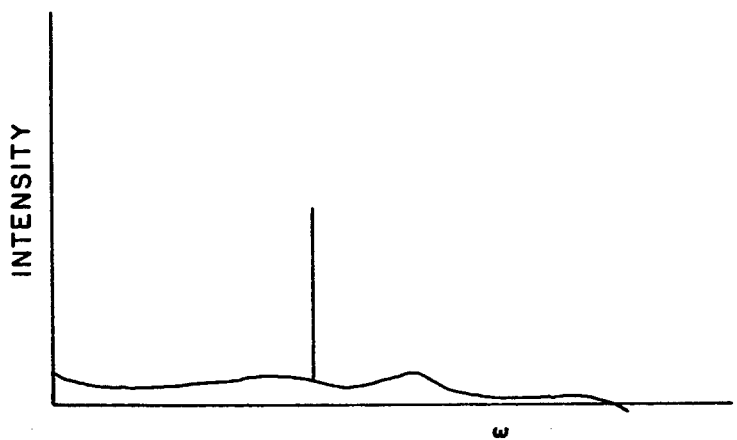
FIG. 9 illustrates a plot of the frequency spectrum of an exemplary pseudoperiodic drive.

FIG. 9 illustrates a plot of the frequency spectrum of a pseudoperiodic drive such as, for example, the pseudoperiodic drive 340 from the pseudoperiodic controller 210. FIG. 9 shows that the pseudoperiodic drive has a broadband frequency spectrum with a dominant peak at the frequency of interest, i.e., the frequency desired for driving the first and second systems 220 and 230. The amplitude of the dominant peak and its magnitude with respect to the remainder of the broad band spectrum depends on the systems driven.

Figure 10A:
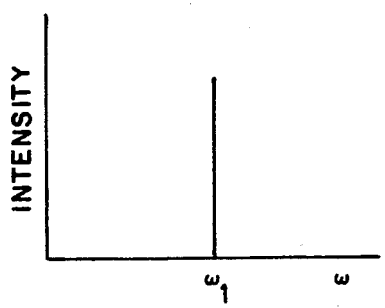
FIGS. 10(a), 10(b), 10(c), 10(d) and 10(e) illustrate the frequency spectrums of various drives combined by the pseudoperiodic controller of the present invention to provide the pseudoperiodic drive.

FIGS. 10(a) through 10(e) illustrate frequency spectrums for outputs combined to produce the pseudoperiodic signal illustrated, for example, in FIG. 9. FIG. 10(a) illustrates a dominant peak or impulse at one frequency $\omega_1$ which represents a cosine wave output of the periodic drive source 310 (FIG. 8). Besides a cosine wave, a sine wave or other periodic signal, such as a square wave or other more-complex periodic pattern, can be output of the periodic drive source 310 to provide the periodic drive.

Figure 10B:
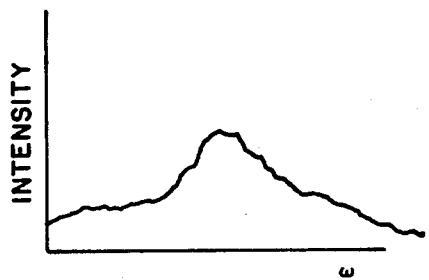

FIG. 10(b) illustrates the frequency spectrum of a chaos output from the perturbing drive source 320. The chaotic drive can be provided by an electrical circuit as later discussed below with reference to FIGS. 14–16.

Figure 10C:
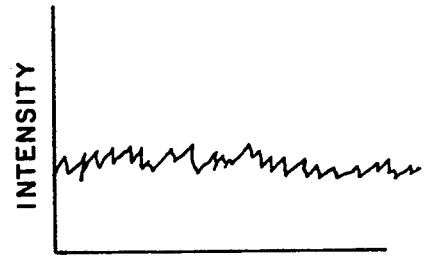

FIG. 10(c) illustrates the frequency spectrum of a noise drive output from the perturbing drive source 320. The noise drive can be a white noise drive having a broadband frequency spectrum. A noise drive can be made similar to a chaotic drive if the noise is filtered, i.e., tailored, so that it has a frequency spectrum having a narrow bandwidth. This produces a tailored noise as illustrated FIG. 10(d).

Figure 10D:
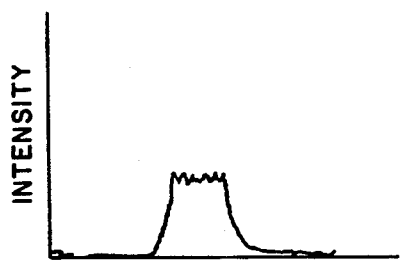
Figure 10E:
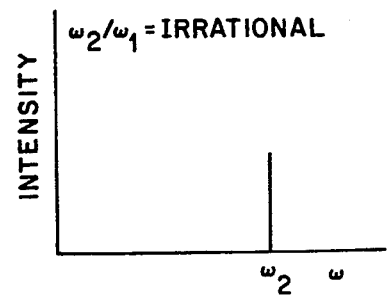

FIG. 10(e) illustrates the frequency spectrum of an incommensurate frequency output from the perturbing drive source 320 (FIG. 8). An incommensurate frequency is a frequency $\omega_2$ that has a ratio with the frequency $\omega_1$ of the periodic drive that is an irrational number, such as the number $\pi$ (3.1415926 . . . ).

Figure 11A:
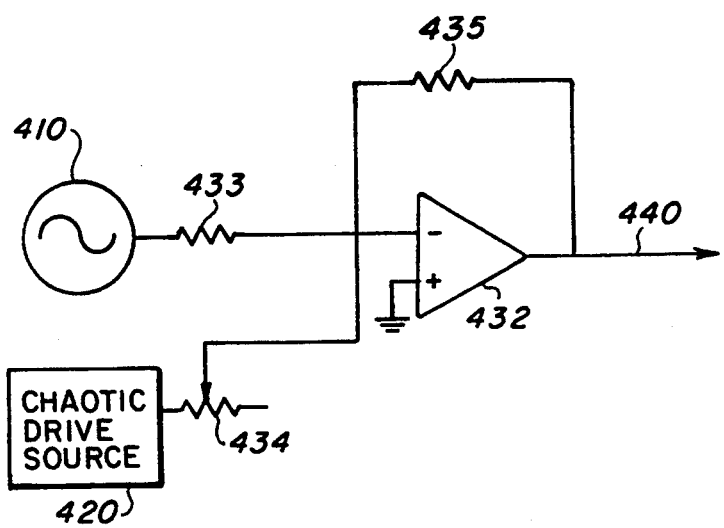
FIGS. 11(a), 11(b), 11(c), 11(d), 11(e), 11(f), 11g), 11(h), 11(i), 11(j), 11(k), 11(l), 11(m), 11(n), 11(o) and 11(p) illustrate schematic block diagrams of different embodiments of the pseudoperiodic controller of the present invention.
Figure 11B:
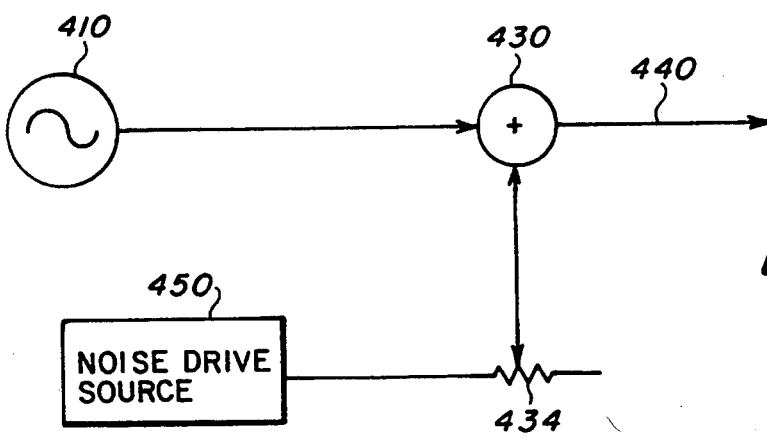
Figure 11C:
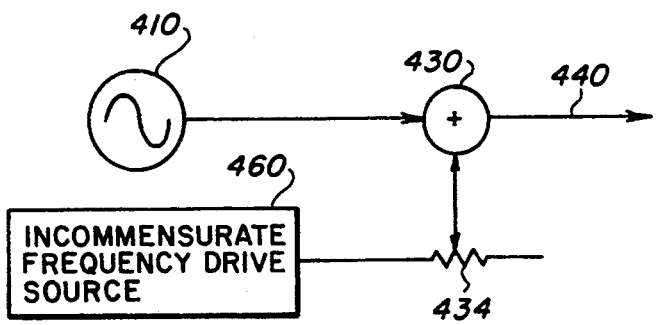
Figure 11D:
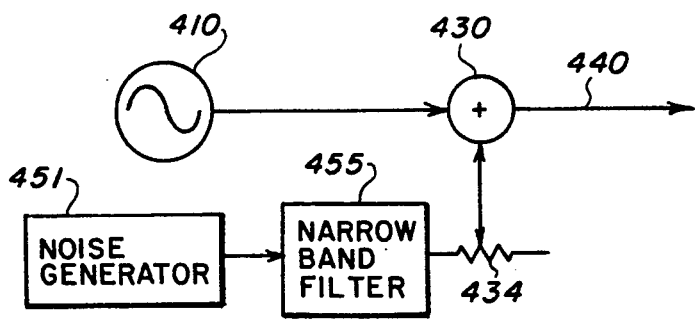
Figure 11E:
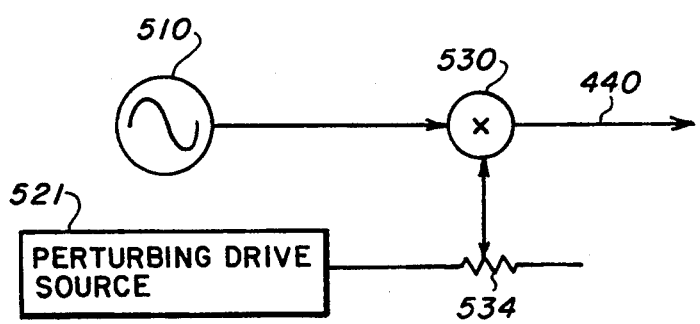
Figure 11F:
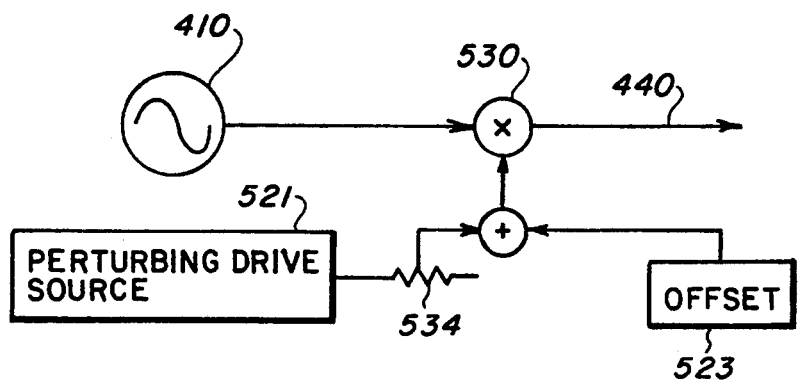
Figure 11G:
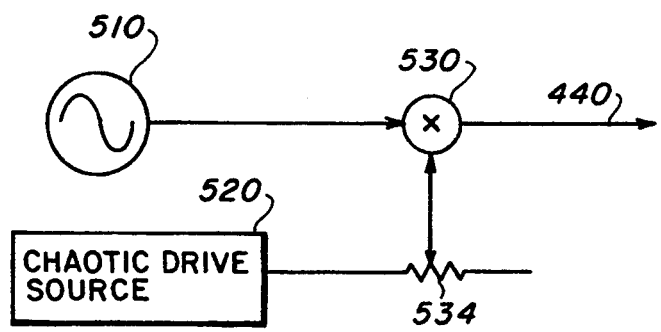
Figure 11H:
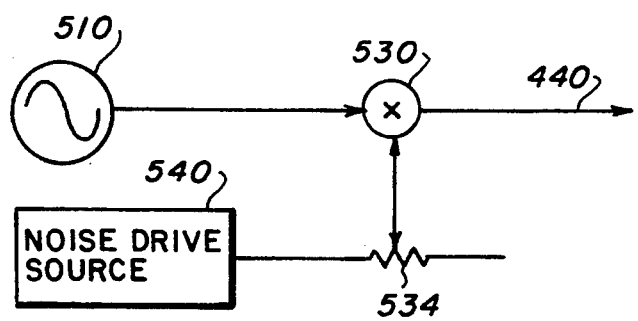
Figure 11I:
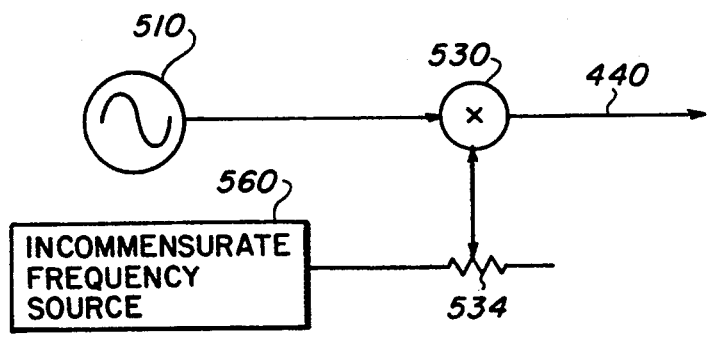
Figure 11J:
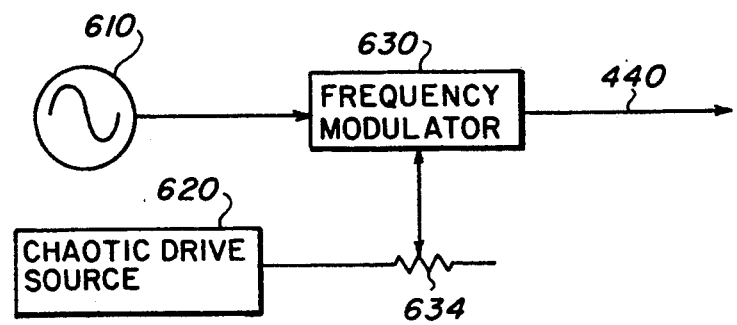
Figure 11K:
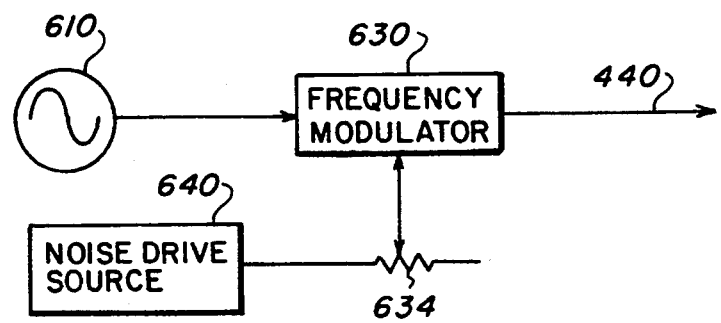
Figure 11L:
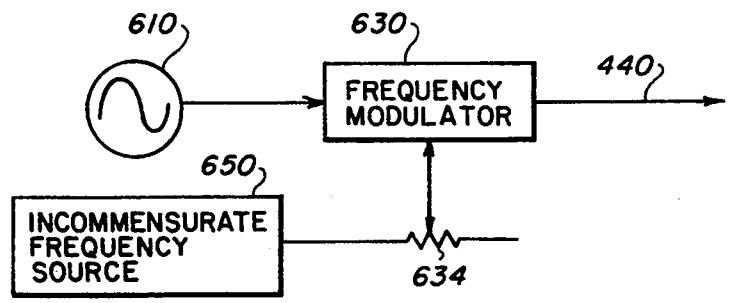
Figure 11M:
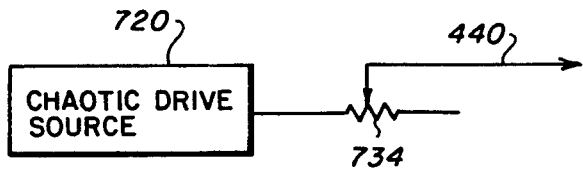
Figure 11N:
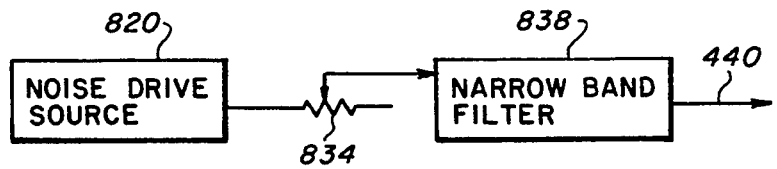
Figure 11O:
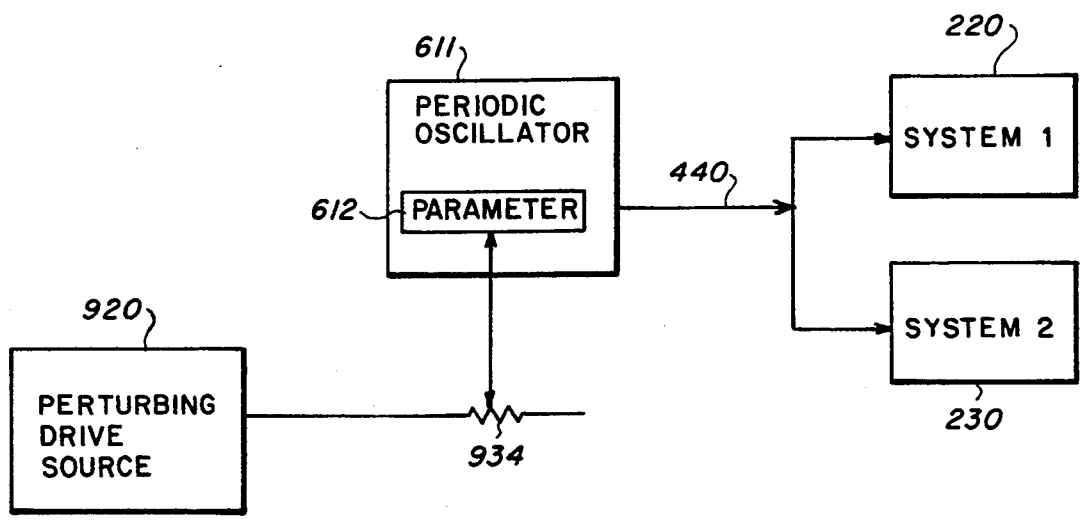
Figure 11P:
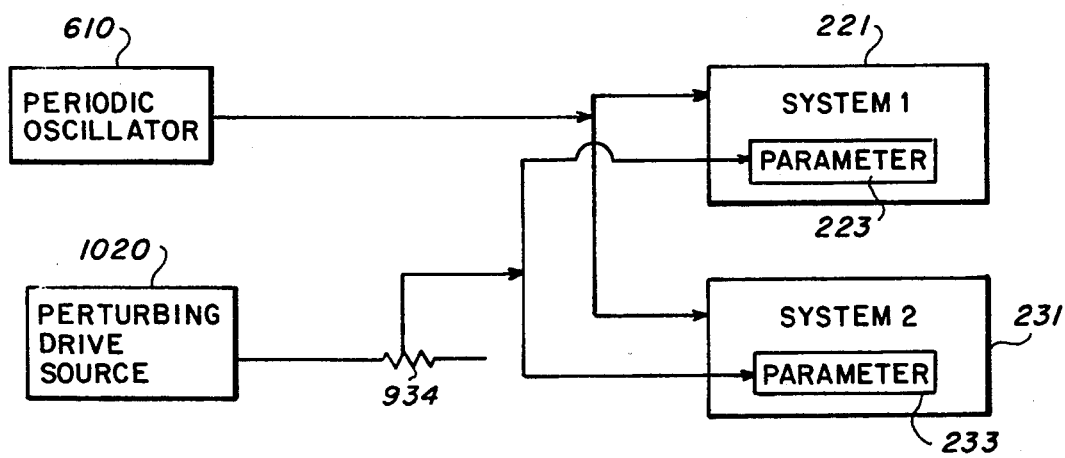

FIGS. 11(a) through 11(p) illustrate schematic block diagrams of different embodiments of the pseudoperiodic controller of the present invention. FIG. 11(a) illustrates an exemplary circuit for adding the periodic drive output of a periodic drive source 410 with a chaotic drive output of a chaotic drive source 420 to provide a pseudoperiodic drive source output 440. The adder can be made of an electrical adder circuit using operational amplifier 432, feedback resistor 435 and input resistor 433. A variable resistor 434 is used to adjust an amount of the chaotic drive added to the periodic drive. Both the periodic drive 410 and the chaotic drive source 420 can also be built from electrical circuits. The periodic drive 410 can be a known oscillator circuit or a known function generator such as those manufactured by Hewlett Packard. The Hewlett Packard function generator preferably generates a sine wave of a frequency of around 400 Hz. The chaotic drive source can be built by an electrical circuit as later discussed below in reference to FIGS. 14–16.

Instead of electrical circuits, the controller 210 can be built to combine optical drive signals, to combine electromagnetic flux or radiant energy, to combine pneumatic or hydraulic control paths or even to combine signals traveling on mechanical control rods or cables. Therefore, the following figures are illustrated in block diagram form to illustrate variations in different embodiments of the present invention without limiting them to particular forms of construction.

FIG. 11(b) illustrates another embodiment of the present invention for adding an amount of a noise output of a noise drive source 450 selected by variable resistor 434 to produce the pseudoperiodic drive of output 440. In an electrical implementation, the noise drive source 450 is preferably a General Radio 1390-B noise generator to provide a noise with a spectrum that is flat to 20 Khz.

FIG. 11(c) also illustrates another embodiment of the present invention wherein an adder 430 adds a portion of an incommensurate frequency drive output of an incommensurate frequency source 460 selected by variable resistor 434 to the periodic drive output of the periodic drive source 410 to produce the pseudoperiodic output 440. In an electrical implementation, a Hewlett Packard function generator preferably generates a sine wave of a frequency of around 400 Hz.

FIG. 11(d) illustrates an embodiment of the present invention where a noise output of a noise generator 451 is tailored by a narrow band filter 455 to provide a tailored noise drive for the perturbing drive such as the tailored noise illustrated in FIG. 10(d). An adder 430 then adds the tailored noise drive to the periodic drive to provide the pseudoperiodic drive 440.

FIG. 11(e) illustrates a perturbing drive source 521 to provide a perturbing drive for multiplication in a multiplier 530 with a periodic drive output of a periodic drive source 510 to produce a pseudoperiodic drive output 440. As illustrated in FIG. 11(f), the drive multiplied in multiplier 530 can be the perturbing drive with an offset added thereto to produce the pseudoperiodic drive as follows:

pseudoperiodic drive=(r+perturbing drive)×periodic drive, where r is an offset which possibly may be zero.

FIGS. 11(g) through 11(i) respectively illustrate either a chaotic drive source 520, a noise drive source 540 or an incommensurate frequency source 560 to provide a perturbing drive for multiplication in a multiplier 530 with a periodic drive output of a periodic drive source 510 to modulate the periodic drive and produce a pseudoperiodic drive output 440.

FIGS. 11(j) through 11(l) illustrate embodiments of the present invention where a chaotic drive source 620, a noise drive source 640 or an incommensurate frequency drive source 650 produce outputs to frequency modulate in a frequency modulator 630 a periodic drive output of a periodic drive source 610. A variable resistor 634 selects an amount of drive for frequency modulation of the output of the periodic drive 610 to produce the pseudoperiodic drive 440. Although a variable resistor 634 is illustrated by example, the variable resistors in all of the embodiments of the invention could be replaced with other devices for controlling an amount of drive. For example, in a pneumatic or hydraulic controller, a needle valve may be used. In an optical controller, a filter may be used. Additionally, in a mechanical controller, the drive could be dampened by tension or compression on a control rod or cable.

FIG. 11(m) illustrates an embodiment where a chaotic drive source 720 by itself is used to directly provide the pseudoperiodic signal. The amount of the chaotic drive output of the chaotic drive source is selected, for example, by the illustrated variable resistor 734 to produce the pseudoperiodic drive 440.

FIG. 11(n) illustrates a further embodiment of the present invention where a noise drive is output of a noise drive source 820 and tailored by a narrow band filter 838 to directly provide the pseudoperiodic drive 440 similar to, for example, the tailored noise illustrated in FIG. 10(d).

FIG. 11(o) illustrates an additional embodiment of the present invention where a parameter 612 of a periodic oscillator 611 is affected by adding a perturbing drive from source 920. The parameter 612 in the periodic oscillator 611 is any state variable or part of the periodic oscillator which has a bearing on the output of the periodic oscillator 611. For example, in a periodic oscillator formed of an electronic circuit, the parameter 612 could be any electrical node between components. The source 920 can be any of a chaotic drive source, a noise drive source or an incommensurate frequency drive source. Furthermore, an amount of the drive output of the source 920 can be selected or limited by a variable device such as the illustrated variable resistor 934.

FIG. 11(p) illustrates a further embodiment of the present invention where a parameter of each system is modified by the output of a perturbing drive source 1020. A periodic oscillator 610 drives each of the first and second systems 221 and 231. The perturbing drive source 1020 provides a drive affecting a parameter 230 or 233 in each of the respective first and second systems 221 and 231. The perturbing drive source 1020 can be a chaotic drive source, a noise drive source or an incommensurate frequency drive source. Furthermore, an amount of the drive for affecting each parameter can be selected or adjusted by the illustrated variable resistor 934.

A more specific example of using a pseudoperiodic drive may be seen by using the Duffing equations, which are well known in the art, as a response system. The Duffing equations of motion are:

$$\frac{dw_1}{dt} = w_2 \qquad (6)$$

$$\frac{dw_2}{dt} = -kw_2 + w_1^3 + \alpha v + \beta$$

where v is the drive, either sinusoidal (cos (t)) or pseudoperiodic and k, $\alpha$ and $\beta$ are constants. For the chaos drive the Rössler system Eq.(4) was used.

The case will now be considered where the pseudoperiodic drive is a cosine plus the x-component from a Rössler system Eq.(4) which was tuned to have its large spectral peak at the same frequency as the cosine. In this case let v(t)=cos(t), k=0.05, $\alpha$=0.21, $\beta$=0.15, a=b=0.2, and c=4.5. For these parameters the cosine-driven Duffing system has period-1, period-2 and period-3 attractors coexisting with period-2 and -3 overlapping in the 2 dimensional response sub-space for variables $w_1$ and $w_2$. In this case the response is not stable when the periodic drive is completely replaced by the chaotic Rössler x(t). The behavior of the response then becomes chaotic itself, and synchronization is not possible. Therefore Eq. (5) must be used to build a pseudoperiodic drive.

The case where $\epsilon$=0.129 will be examined first. Using this pseudoperiodic drive the period-3 attractor ceases to exist (becomes unstable), which will be commented on later. The period-1 remains and the period-2 loses its multiplicity—it changes to an attractor which appears much like the original period-2, but which has only one domain of attraction. This is called a pseudoperiod-2 attractor. FIG. 12 shows the attractors of the cosine-driven and the pseudoperiodically driven Duffing along with the period-2 and pseudoperiod-2 time series. The latter go for ~30 cosine cycles before getting out of phase (as they must), but the pseudoperiodic trajectory continues to mimic the period-2 behavior forever. Hence, the Duffing system behaves much like a period-2 attractor, but without the multiplicity.

Figure 12B:
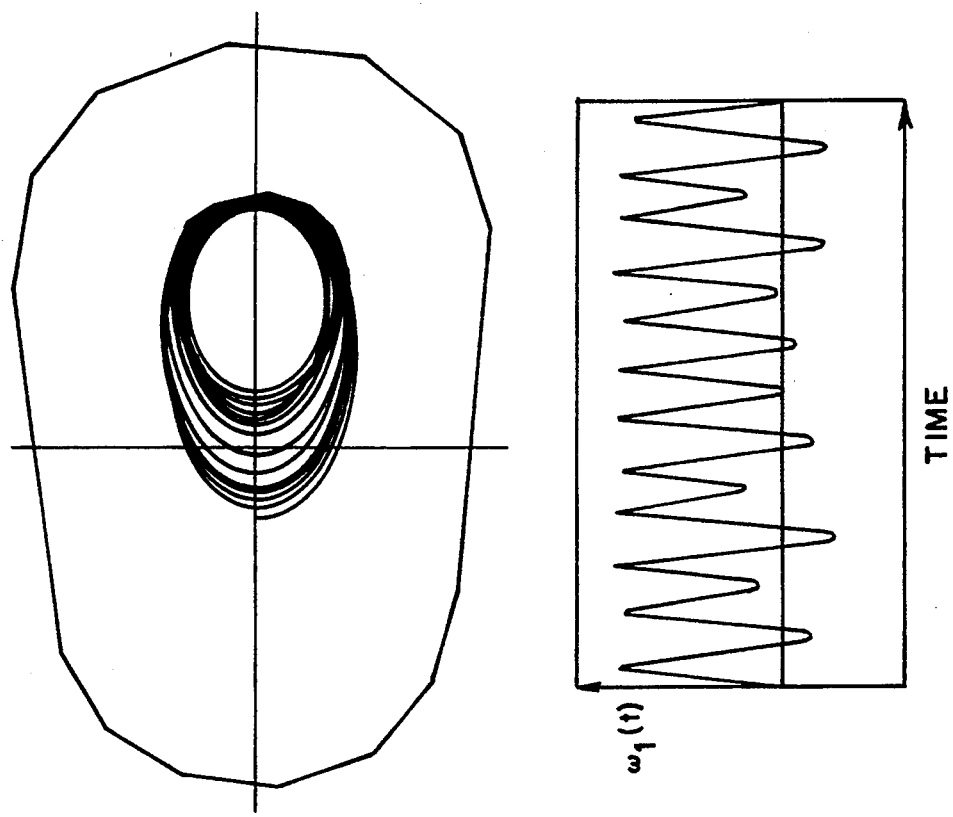
FIGS. 12(a) and 12(b) illustrate the Duffing period-1, -2, and -3 attractors and the pseudoperiodic response attractors.
Figure 12A:
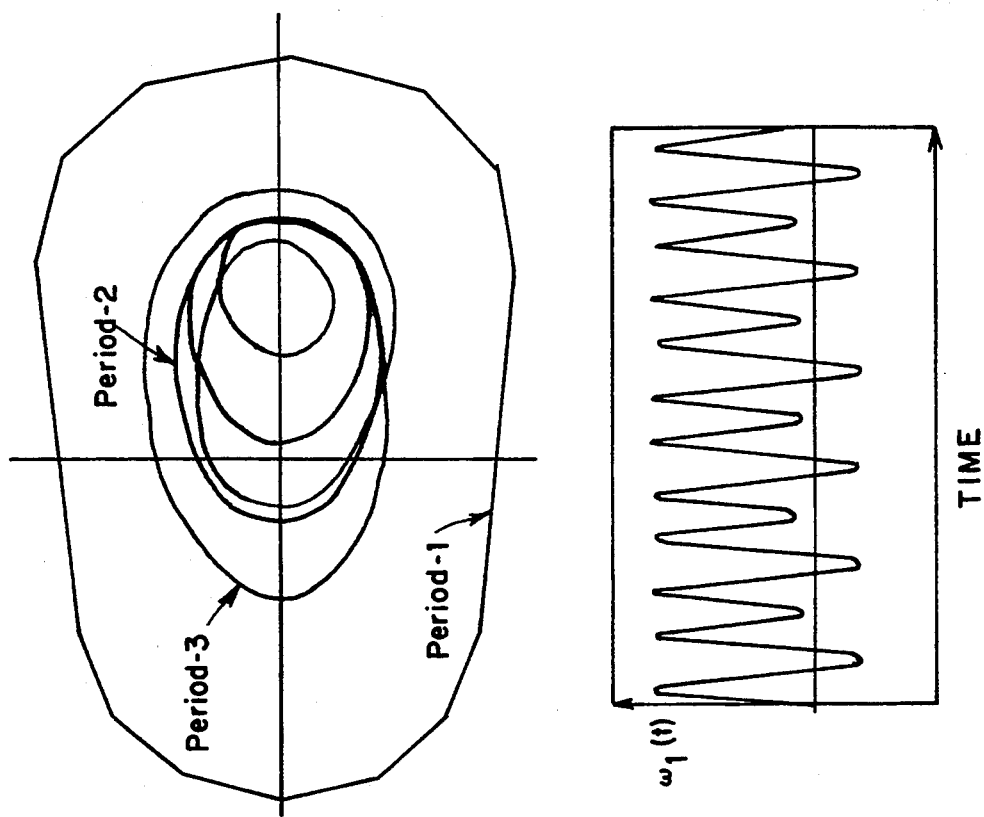

FIG. 12(a) shows the period-1, -2, and -3 attractors for the cosine-driven Duffing. The situation is rather complicated with 6 different domains of attraction. There is also evidence that there are fractal basin boundaries.

FIG. 12(b) shows the pseudoperiod-1 and -2 attractors. The situation is greatly simplified. All initial conditions for the period-3 attractor have been converted to pseudoperiod-2 basin points. Only one pseudoperiod-2 domain exists. However, the overall shape of the pseudoperiod-2 basin is very close to the combined basins of the period-2 and -3 attractors in FIG. 12(a) without the apparent fractal structure.

This system has $\epsilon$ been explored for other e values and for other Rössler c parameters which change the spectral nature of the chaos. In general, it has been found that there is a threshold (e value) above which the period-3 orbit becomes unstable (going to a period-2) and, simultaneously, the period-2 loses its multiplicity.

Figure 13:
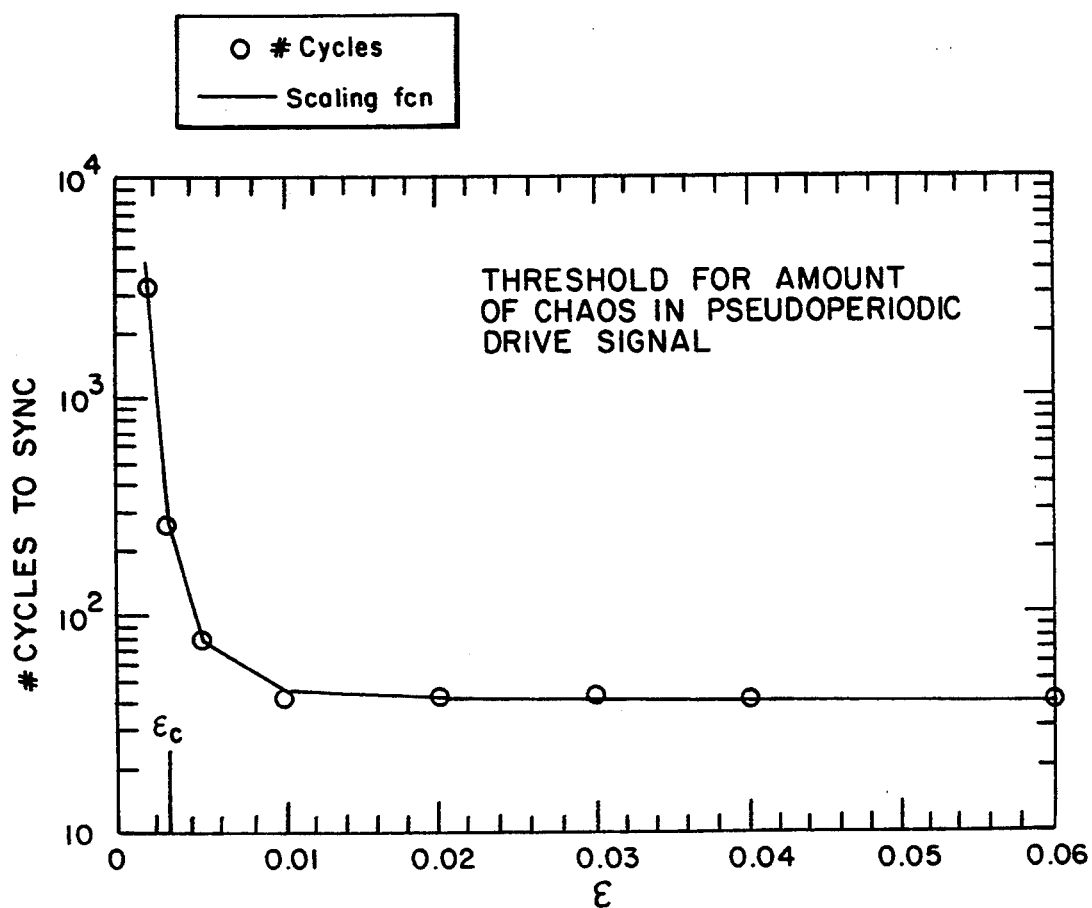
FIG. 13 illustrates a threshold plot, showing how the number of drive cycles needed to synchronize two period doubled Duffing equation systems depends on the amount of chaos added to the periodic drive.

FIG. 13 shows the relation of time for synchronization to $\epsilon$ for various Rössler c parameter values. For c=4.5 the number of cosine cycles (averaged over the pseudoperiod-2 basin) for the Duffing to converge to the pseudoperiod-2 trajectory as a function of e scaled as $1/(\epsilon-\epsilon_c)^\nu$ above threshold, with $\epsilon_c=0.0154$ and $\nu=0.955$. The $\epsilon_c$ threshold amounts to adding only a few percent chaos (in terms of amplitudes) to the cosine drive to eliminate multiplicity. This scaling is like that for transient chaos. This suggests that the loss of attractor multiplicity comes from a crisis. Similar behavior occurs for other c values.

For Rössler c values in which the chaos is more broad band (above $c \approx 8.3$), thresholds have also been found in the same place, but the Duffing system often goes unstable (a positive conditional Lyapunov exponent) at moderate $\epsilon$ values and the nature of the trajectories does not emulate the period-2 attractor as well. Hence, spectral similarity and, perhaps, small positive Lyapunov exponents for the chaotic component of the drive appear necessary for emulation of the multiple-period behavior and the stability of pseudoperiodic trajectories.

The loss of stability of the period-3 Duffing at the threshold is an example of the destruction of a basin boundary and the synchronization of the systems to only the new attractor. This is the generalization to different attractors and basins of the previously described phenomena of elimination of multiple domains and synchronization of all points in the same basin to each other on the attractor.

Figure 14:
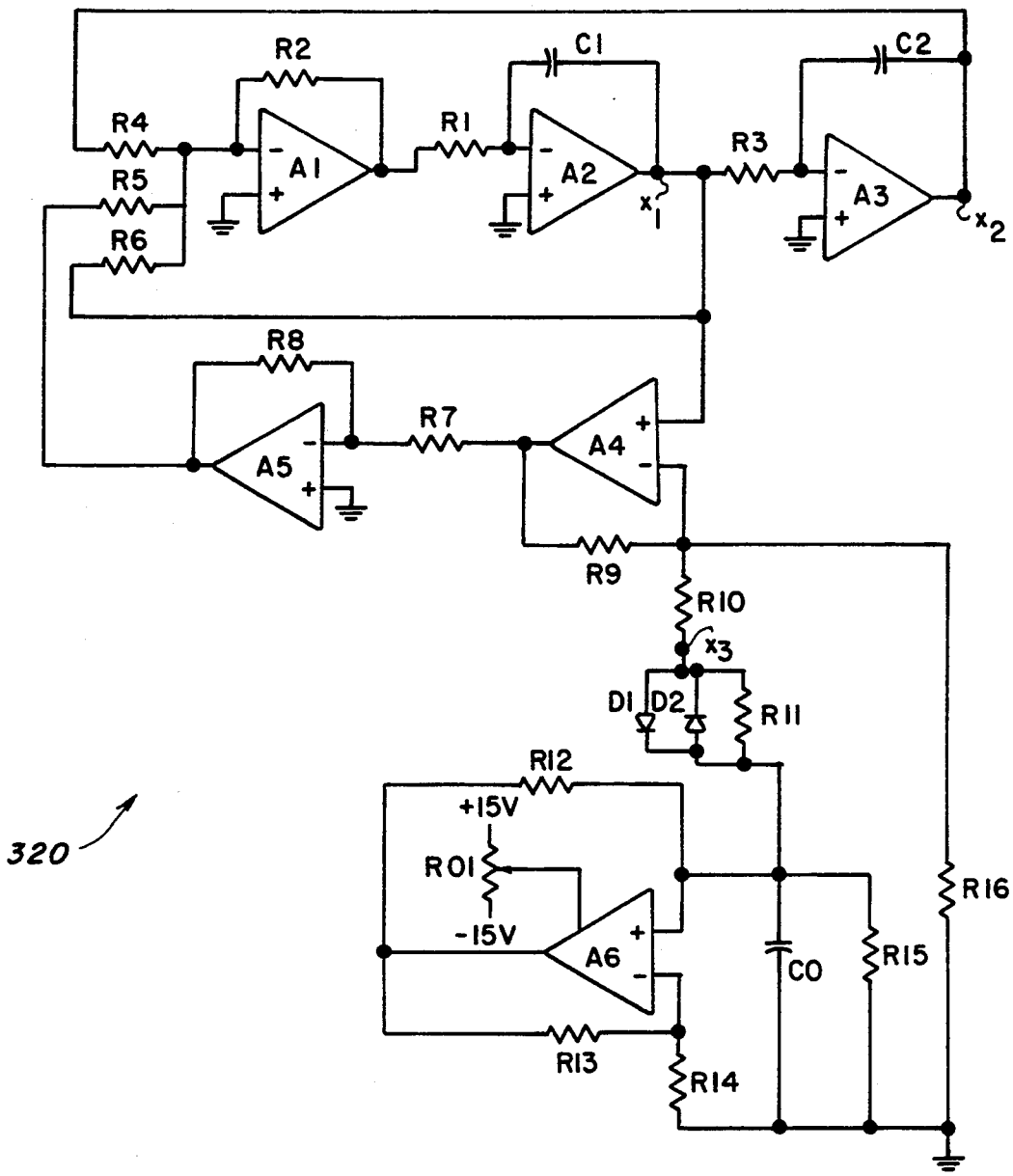
FIGS. 14, 15 and 16 illustrate schematic diagrams of circuits for generating a chaotic signal for combination with a periodic signal in the controller of the present invention.

FIG. 14 illustrates a detailed schematic diagram of a chaotic drive source for the controller of the present invention. The electronic circuit illustrated in FIG. 14 generates a chaotic signal using a Newcomb circuit. The circuit in FIG. 14 was built using an unstable oscillator with a hysteritic element. The equations for this electrical circuit are as follows:

$$\frac{dx_1}{dt} = 10^3(1.5x_2 + 2.2x_1 - 2.2x_3) \qquad (7)$$

$$\frac{dx_2}{dt} = 10^3 x_1$$

$$\epsilon\frac{dx_3}{dt} = (1 - x_3^2)(Sx_1 - D + x_3) - \delta_3 x_3$$

In these equations, $\omega=0.3$, $S=1.667$, $D=0.0$ and $\delta_3=0.001$. The equation $x_3$ is a phenomological equation used to model the hysteresis and is illustrated by the electronic circuit in FIG. 14. An extra damping term may be needed for the equation $x_2$ to simulate the effect of losses in the circuit.

The circuit illustrated in FIG. 14 generates a chaotic drive output at any of a number of locations, such as, $x_1$, $x_2$ or $x_3$. In the circuit illustrated in FIG. 14, the amplifiers A1 through A6 preferably are a type 741 operational amplifier. The resistors R1, R3, R7, R8, R16 preferably are 100 kΩ. Resistor R2 is preferably a 330 kΩ resistor; resistor R4 is preferably a 220 kΩ resistor; resistors R5 and R6 are preferably 150 kΩ resistors; resistors R9 and R15 are preferably 20 kΩ resistors; resistor R10 is preferably a 3 kΩ resistor; resistor R11 is preferably a 500 kΩ resistor; resistors R13 and R14 are preferably 10 kΩ resistors and resistor R01 is preferably a 10 kΩ potentiometer; capacitors C0 and C2 are preferably 0.001 μF capacitors and capacitor C1 is preferably 0.01 Ωf capacitor. The diodes D1 and D2 are preferably 1N4739A diodes.

Figure 15:
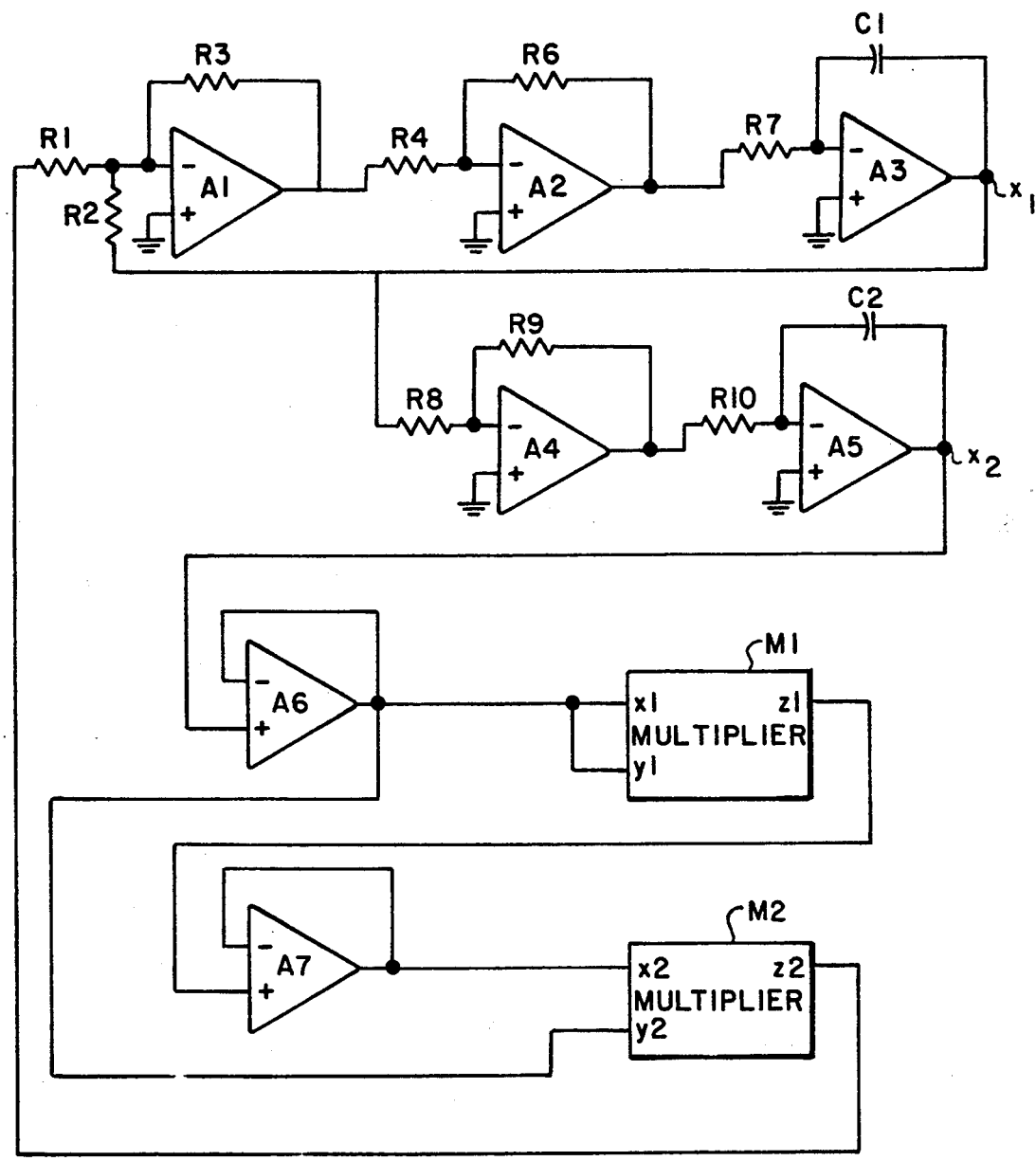

FIG. 15 illustrates a detailed schematic diagram of a circuit for generating a chaotic signal for combination with a periodic signal in the controller of the present invention. The electrical circuit illustrated in FIG. 15 models the Duffing system of the Ueda version. Equations of motion for this system were stated earlier as Eq.(6). Appropriate values for k, $\alpha$, $\beta$ and v are substituted in equation (6) to yield the following chaotic equations:

$$\frac{dx}{dt} = 10^5 y \qquad (8)$$

$$\frac{dy}{dt} = 10^5(B\cos(\omega t) - 0.256y - x^3)$$

where B and $\omega$ are the amplitude and angular frequency, respectively, of the sinusoidal drive.

In the circuit of FIG. 15, the resistors R1, R3, R4 and R6 are preferably 10 kΩ resistors; the resistor R2 is preferably a 39.2 kΩ resistor. The resistors R7 and R10 are preferably 100 kΩ resistors, and resistors R8 and R9 are preferably 1 MΩ resistors. Capacitors C1 and C2 are preferably 0.001 μF capacitors. Amplifiers A1 through A7 are preferably 741 type operational amplifiers. Analog multipliers M1 and M2 are preferably Analog Devices AD632 four-quadrant analog multiplier chips. The Duffing circuit chaos source of FIG. 15 has outputs at either $x_1$ and $x_2$. However, the Duffing circuit of FIG. 15 can alternatively be used as a response system. When the circuit of FIG. 15 is instead used as a response system, the drive input preferably is connected to the node between resistors R4 and R6 and driven through a 10 kΩ resistor.

Figure 16:
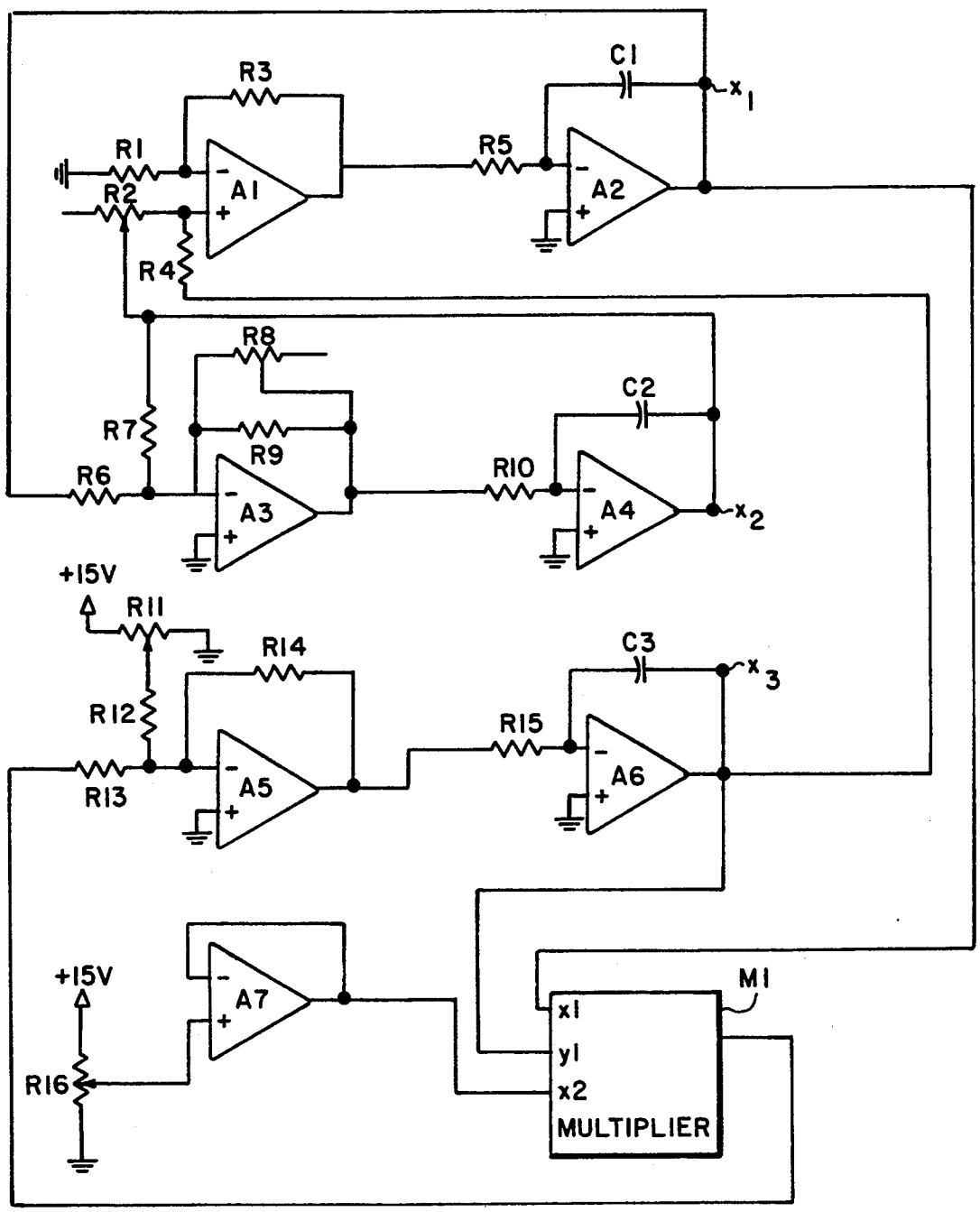

FIG. 16 illustrates a detailed schematic diagram of a circuit for generating a Rössler chaotic signal for combination with a periodic signal in the controller of the present invention. The known Rössler system was defined earlier by the three equations of Eq(4).

In the system for certain parameter values, i.e. $a=b=0.2$, $4.35<c<7.0$, the behavior is generally chaotic but the x and y components resemble sinusoidal signals. The Rössler equations modified for the circuit with a parameter $\alpha$ of $1\times10^{-4}$ with the parameters a, b and c set so that the circuit is chaotic are as follows:

$$\frac{dx}{dt} = \alpha(-y - z) \qquad (9)$$

$$\frac{dy}{dt} = \alpha(x + ay)$$

$$\frac{dz}{dt} = \alpha(b + xz - cz)$$

In FIG. 16, the amplifiers A1 through A7 are preferably type 741 operational amplifiers. Resistors R1, R3, R4, R6, R9, R12, R13 and R14 are preferably 10 kΩ resistors. Furthermore resistors R5, R7, R10 and R15 are preferably 100 kΩ resistors and resistors R2, R8 and R16 are preferably 100 kΩ potentiometers. Capacitors C1, C2 and C3 are preferably 0.001 μF capacitors. The multiplier M1 is preferably an Analog Devices AD632 four-quadrant analog multiplier chip. The chaotic drive output of the Rössler circuit of FIG. 16 can be taken from any outputs $x_1$, $x_2$ and $x_3$.

Figure 17:
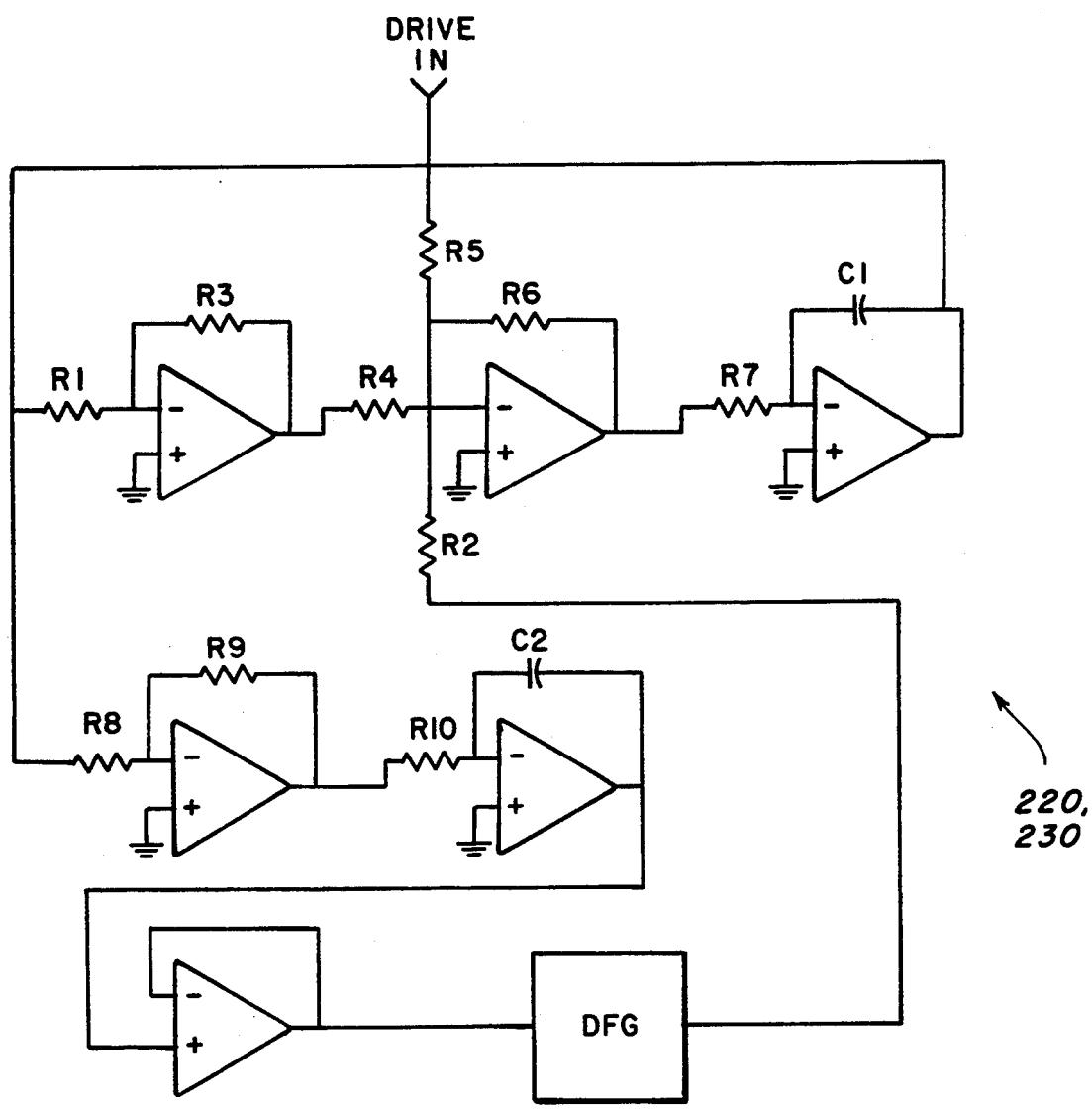
FIG. 17 illustrates a schematic diagram of a circuit to simulate the Duffing equations used as a response system to show the use of a pseudoperiodic drive signal on electronic circuits.
Figure 18:
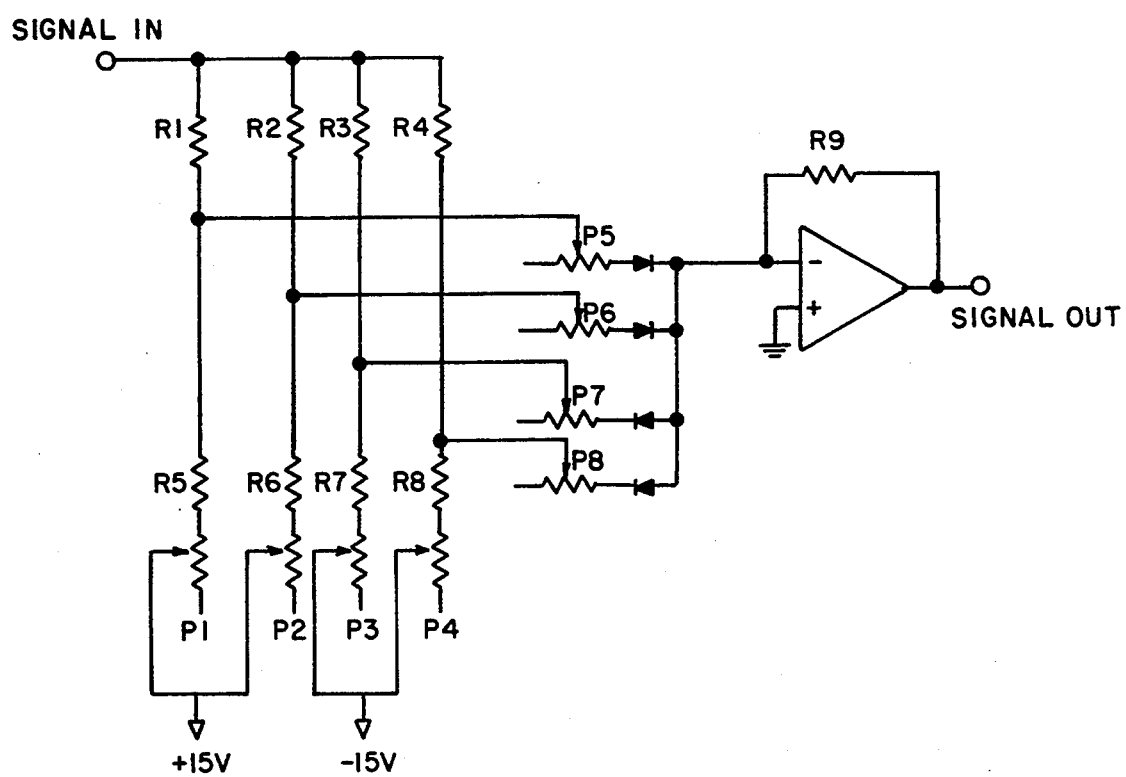
FIG. 18 illustrates a schematic diagram of a circuit used to generate the nonlinear function for the circuit of FIG. 17.

FIGS. 17 and 18 illustrate a detailed schematic diagram for a response circuit modeled on the Duffing equations for demonstrating the synchronization of two period doubled driven systems. This circuit may be described by the equations:

$$\frac{dy}{dt} = a(A\cos(\omega t) + C - 0.2y - G(x)) \quad (10)$$

$$\frac{dx}{dt} = ay$$

$$G(x) = \begin{cases} 0 (abs(x) < 1.2) \\ x - 1.2sgn(x) \ (1.2 \leq abs(x) < 2.6) \\ 2x - 3.8sgn(x) \ (2.6 \leq abs(x)) \end{cases}$$

In FIG. 17, the resistors R1, R3, R4, R5 and R6 are preferably 10 k$\Omega$. The resistor R2 is preferably 39 k$\Omega$, the resistors R7 and R10 are preferably 100 k$\Omega$, and the resistors R8 and R9 are preferably 1 M$\Omega$. The capacitors C1 and C2 are preferably 0.001 $\mu$F. The operational amplifiers are preferably type 741. The square marked "DFG" refers to the circuit in FIG. 18.

In FIG. 18, resistors R1, R2, R3, R4 and R9 are preferably 100 k$\Omega$. Resistors R5 and R7 are preferably 680 k$\Omega$. Resistors R6 and R8 are preferably 2 M$\Omega$. Potentiometers P1 and P3 are preferably 20 k$\Omega$, 20 turn potentiometers. Potentiometers P2 and P4 are preferably 50 k$\Omega$, 20 turn potentiometers. Potentiometers P5, P6, P7 and P8 are preferably 20 k$\Omega$, 20 turn potentiometers in parallel with a 100 k$\Omega$ resistor. The diodes are preferably each type 1N485B. The amplifier is preferably type 741.

The parameter C in Eq. (10) is a constant offset that may be added to the drive, A is the amplitude and e is the angular frequency of the periodic part of the drive. The time factor $a$ is $1 \times 10^4 \text{ s}^{-1}$. The function G(x) is a piecewise linear approximation to $x^3$ which was used to make the circuit easier to characterize and match. The drive frequency $\omega$ was 672 Hz, the offset C was 0.3 V and the amplitude of the periodic part of the drive was 5.19 V.

Figure 19:
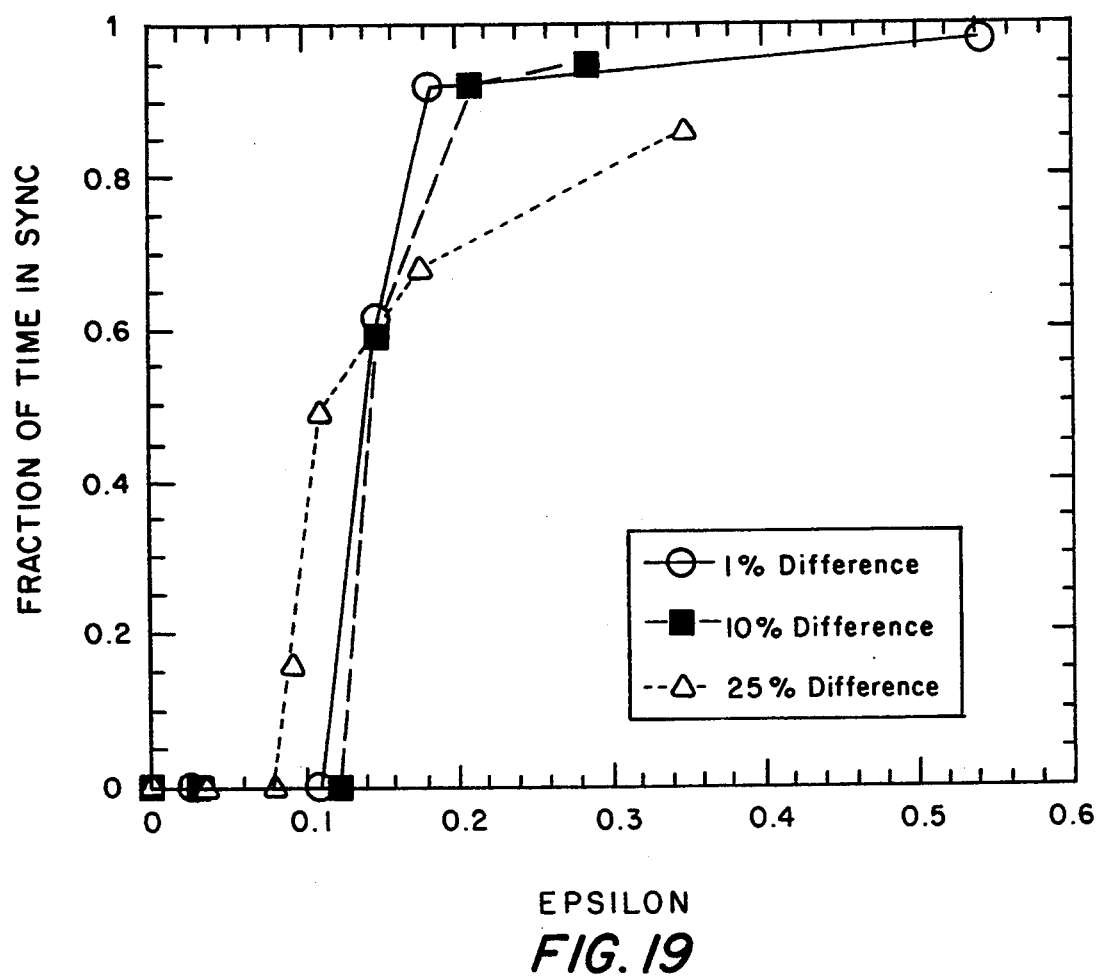
FIG. 19 shows the fraction of time that the two Duffing circuits of FIG. 17 started out of phase are synchronized as a function of the amount of chaos (epsilon) added to the periodic driving signal and for various mismatches between the resistor R4 in each circuit.

FIG. 19 shows the fraction of time that the driven period doubled Duffing circuits were synchronized when the $x_2$ signal from the Newcomb circuit was added to the periodic drive after being multiplied by a number $\epsilon$ to create a pseudoperiodic driving signal. When $\epsilon$ exceeded a threshold of about 0.11, the two circuits were synchronized 90% of the time. To demonstrate that the pseudoperiodic drive still worked for badly mismatched systems, resistor R4 was reduced by 10% or 25% in one of the circuits to see if synchronization still took place. The figure shows that synchronization still occurred.

The present application is applicable to (I.) any driven system having an originally periodic drive, (II.) which is capable of multiple periods (period-doubling or tripling etc.), and/or (III.) which is capable of having multiple basins of attraction. Pseudoperiodic drives may be used with arrays of semiconductor detectors such as those used to detect optical, electrical, thermal or pressure signals, or with Josephson junction arrays used as voltage references or magnetic field detectors, when each element of such an array is driven by a common periodic signal such that period multiplication or multiple basins of attraction exist. A pseudoperiodic drive (consisting of an electrical, optical or magnetic signal) might be preferable to a periodic drive when it was necessary for all elements of such an array to be synchronized, i.e. each element must do the same thing at the same time. A pseudoperiodic drive might also be useful for synchronizing nonlinear chemical processing systems or chemical reactors which are driven by incoming streams of chemicals. Furthermore, the pseudoperiodic drive of the present invention is applicable to physiological or biosystems. For example, two similar valves in an artificial heart can be controlled with a pseudoperiodic signal. Furthermore, the pseudoperiodic signals can as well be implemented in pacemakers to control, in synchronization, the cells of an actual human heart. Also, pseudoperiodic drives can be used for artificial respirators. Additionally, the pseudoperiodic signals can be used for controlling artificial limbs or robots. For example, these pseudoperiodic signals can be used to control muscles in one's arm. The pseudoperiodic drive of the present invention is very applicable to biosystems because biosystems do not depend on complete accuracy or rely on an output occurring at a predictable instance of time. In other words, biosystems are more forgiving than sequential networks or traditionally known control systems and computer systems. Pseudoperiodic drives can also be used to provide a clock signal of a neural network. In conventional neural networks, the clock signal is periodic. Future neural networks may be implemented as "fuzzy", or inexact systems, where perfect periodic signals are not necessary, so that pseudoperiodic timing signals may be used to prevent different elements of the network from occupying different phases or attractors.

While the invention has been illustrated and described in detail in the drawings and foregoing description, it will be recognized that many changes, modifications and new uses will occur to those skilled in the art. It is therefore to be understood that, within the scope of the appended claims, the invention may be practiced otherwise than as specifically described.

What is claimed and desired to be secured letters patent of the United States is:

1. A controller for driving in synchronization at least two response systems, said controller comprising:
    (a) combining means responsive to a periodic signal and to a perturbing-signal for producing a pseudoperiodic drive signal different from the periodic signal and different from the perturbing signal;
    (b) a stable periodic drive source coupled to said combining means (a) for producing a stable periodic signal of a first frequency, the periodic signal having a periodically repeating waveform, and for applying the periodic signal only to said combining means (a);
    (c) a perturbing drive source coupled to said combining means (a) for producing a perturbing signal and for applying the perturbing signal to said combining means (a). said perturbing drive source being unresponsive to the periodic signal produced by said periodic drive source (b); and
    (d) means coupled to said combining means (a) for providing the pseudoperiodic drive signal to the at least two response systems so as to synchronize the at least two response systems with one another.

2. The controller of claim 1, wherein said perturbing drive source (c) comprises a chaotic drive source.

3. The controller of claim 2, wherein said combining means (a) is selected from the group consisting of an adder, a modulator for multiplying the periodic signal and the perturbing signal to produce the pseudoperiodic drive signal, and a frequency modulator for frequency modulating the periodic signal with the perturbing signal to produce the pseudoperiodic drive signal.

4. The controller of claim 1, wherein said perturbing drive source (c) comprises a noise drive source.

5. The controller of claim 4, wherein said noise drive source comprises an electrical white noise circuit.

6. The controller of claim 4, wherein said noise drive source comprises an electrical noise generator and a filter operatively connected to an output of said electrical noise generator to tailor an output of said electrical noise generator by narrow band filtering.

7. The controller of claim 4, wherein said combining means (a) is selected from the group consisting of an adder, a modulator for multiplying the periodic signal and the perturbing signal to produce the pseudoperiodic drive signal, and a frequency modulator for frequency modulating the periodic signal with the perturbing signal to produce the pseudoperiodic drive signal.

8. A controller of claim 1, wherein said perturbing drive source (c) comprises an incommensurate frequency drive source for providing a periodic perturbing signal, the perturbing signal having a second frequency, the ratio of the second frequency to the first frequency being an irrational number.

9. The controller of claim 8, wherein said combining means (a) is selected from the group consisting of an adder, a modulator for multiplying the periodic signal and the perturbing signal to produce the pseudoperiodic drive signal, and a frequency modulator for frequency modulating the periodic signal with the perturbing signal to produce the pseudoperiodic drive signal.

10. The controller of claim 1, said controller being unresponsive to each of the response systems.

11. The controller of claim 10, wherein said perturbing drive source is selected from the group consisting of chaotic, noise, and incommensurate frequency drive sources.

12. The controller of claim 10, wherein said combining means (a) is selected from the group consisting of an adder, a modulator for multiplying the periodic signal and the perturbing signal to produce the pseudoperiodic drive signal, and a frequency modulator for frequency modulating the periodic signal with the perturbing signal to produce the pseudoperiodic drive signal.

13. The controller of claim 1, said controller being for driving in synchronization at least two response systems, each of the response systems having multiple periods when driven by a periodic signal of the first frequency, said controller driving the at least two response systems in synchronization by reducing the number of periods of the at least two response systems.

14. The controller of claim 13, wherein said perturbing drive source is selected from the group consisting of chaotic, noise, and incommensurate frequency drive sources.

15. The controller of claim 13, wherein said combining means is selected from the group consisting of an adder, a modulator for multiplying the periodic signal and the perturbing signal to produce the pseudoperiodic periodic drive signal, and a frequency modulator for frequency modulating the periodic signal with the perturbing signal to produce the pseudoperiodic drive signal.

16. The controller of claim 1, said controller being for driving in synchronization at least two response systems, each of the response systems having multiple basins of attraction when driven by a periodic signal of the first frequency, said controller driving the at least two response systems in synchronization by reducing the number of basins of attraction of the at least two response systems.

17. The controller of claim 16, wherein said perturbing drive source (c) is selected from the group consisting of chaotic, noise, and incommensurate frequency drive sources.

18. The controller of claim 16, wherein said combining means (b) is selected from the group consisting of an adder, a modulator for multiplying the periodic signal and the perturbing signal to produce the pseudoperiodic drive signal, and a frequency modulator for frequency modulating the periodic signal with the perturbing signal to produce the pseudoperiodic drive signal.

19. The controller of claim 1, said controller being for driving in synchronization at least two response systems, each of the response systems having multiple domains of attraction when driven by a periodic signal of the first frequency, said controller driving the at least two response systems in synchronization by reducing the number of domains of attraction of the at least two response systems.

20. A method for driving in synchronization at least two response systems, said method comprising the steps of:
(a) combining a periodic signal with a perturbing signal to produce a pseudoperiodic drive signal different from the periodic signal and different from the perturbing signal;
(b) stably producing a stable periodic signal of a first frequency, the periodic signal having a periodically repeating waveform and being for use only by said combining step (a);
(c) producing a perturbing signal for use by said combining step (a), said perturbing signal producing step being unresponsive to the periodic signal produced by said periodic signal producing step (b); and
(d) providing the pseudoperiodic signal to the at least two response systems so as to synchronize the at least two response systems with one another.

21. The method of claim 20, wherein said perturbing signal producing step (c) comprises the sub-step of generating a signal selected from the class consisting of a chaotic, a noise and an incommensurate frequency signal.

22. The controller of claim 1, wherein said perturbing drive source (c) is selected from the group consisting of Lorenz, Duffing, Rössler, and Newcomb systems.

23. The method of claim 20, wherein said combining step (a) is selected from the group consisting of adding, multiplying the periodic signal and the perturbing signal to produce the pseudoperiodic drive, and frequency modulating the periodic signal with the perturbing signal to produce the pseudoperiodic drive.

24. The method of claim 20, said method being unresponsive to each of the response systems.

25. The method of claim 20, said method being for driving in synchronization at least two response systems, each of the response systems having multiple periods when driven by a periodic signal of the first frequency, said method driving the at least two response systems in synchronization by reducing the number of periods of the at least two response systems.

26. The method of claim 20, said method being for driving in synchronization at least two response systems, each of the response systems having multiple basins of attraction when driven by a periodic signal of the first frequency, said method driving the at least two response systems in synchronization by reducing the number of basins of attraction of the at least two response systems.

27. The method of claim 20, said method being for driving in synchronization at least two response systems, each of the response systems having multiple domains of attraction when driven by a periodic signal of the first frequency, said method driving the at least two response systems in synchronization by reducing the number of periods of the at least two response systems.

28. A controller for driving in synchronization at least two response systems, said controller comprising:

(a) combining means responsive to a periodic signal and to a perturbing signal for producing a pseudoperiodic drive signal;

(b) a periodic drive source coupled to said combining means (a) for producing a periodic signal and for applying the periodic signal only to said combining means (a);

(c) a perturbing drive source coupled to said combining means (a) for producing a perturbing signal and for applying the perturbing signal to said combining means (a), said perturbing drive source being unresponsive to the periodic signal produced by said periodic drive source (b); and (d) means coupled to said combining means (a) for providing the pseudoperiodic drive signal to the at least two response systems so as to synchronize the at least two response systems with one another.

* * * * *